US012809144B2

(12) United States Patent
Ishizuya et al.

(10) Patent No.: US 12,809,144 B2
(45) Date of Patent: Nov. 24, 2026

(54) LIGHT EMITTING APPARATUS, DISPLAY APPARATUS, PHOTOELECTRIC CONVERSION APPARATUS, ELECTRONIC DEVICE, ILLUMINATION APPARATUS, AND MOVING OBJECT

(71) Applicant: CANON KABUSHIKI KAISHA, Tokyo (JP)

(72) Inventors: Koji Ishizuya, Kanagawa (JP); Norifumi Kajimoto, Kanagawa (JP); Yojiro Matsuda, Kanagawa (JP); Hiroaki Sano, Kanagawa (JP); Takayuki Ito, Kanagawa (JP); Tetsuo Takahashi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 496 days.

(21) Appl. No.: 18/484,342

(22) Filed: Oct. 10, 2023

(65) Prior Publication Data

US 2024/0057455 A1 Feb. 15, 2024

Related U.S. Application Data

(63) Continuation of application No. PCT/JP2022/015500, filed on Mar. 29, 2022.

(30) Foreign Application Priority Data

Apr. 13, 2021 (JP) ................................ 2021-067636
Feb. 8, 2022 (JP) ................................ 2022-018102

(51) Int. Cl.
*G02B 19/00* (2006.01)
*H10K 59/80* (2023.01)

(52) U.S. Cl.
CPC ....... *G02B 19/0019* (2013.01); *H10K 59/875* (2023.02); *H10K 59/876* (2023.02); *H10K 59/878* (2023.02); *H10K 59/879* (2023.02)

(58) Field of Classification Search
CPC ............ G02B 19/0019; G02B 27/0977; H10K 59/875; H10K 59/876; H10K 59/878; H10K 59/879
See application file for complete search history.

(56) References Cited

U.S. PATENT DOCUMENTS

2012/0133575 A1 5/2012 Hasegawa
2012/0299883 A1 11/2012 Sumida
2022/0158135 A1* 5/2022 Irobe .................... H10K 50/858

FOREIGN PATENT DOCUMENTS

CN 102800814 A 11/2012
JP H04192290 A 7/1992
(Continued)

*Primary Examiner* — Anne M Hines
*Assistant Examiner* — Jose M Diaz
(74) *Attorney, Agent, or Firm* — Canon U.S.A., Inc. IP Division

(57) ABSTRACT

A light emitting apparatus according to the present disclosure includes an organic light emitting element (100) including a reflection surface (S2), a first electrode (2), an organic layer (3) including a light emitting layer (31), a second electrode (4), and a light extraction structure (10). The light emitting layer (31) contains a first light emitting material. A wavelength included in a peak wavelength range of a PL spectrum of the first light emitting material is assumed as a first wavelength $\lambda_1$. An optical distance (Lb) between the light emitting layer (31) and the reflection surface (S2) is a value with which rays of light with the first wavelength ($\lambda_1$), traveling in a first direction (D1) and a second direction (D2) that intersect with a normal direction of a principal surface (S1) of the substrate (1), both are intensified. When the intensified rays of light respectively reach a first inclined
(Continued)

portion (21*a*) and a second inclined portion (21*b*) of the light extraction structure (10), the rays of light respectively are emitted in a third direction (D3) and a fourth direction (D4) that are directions substantially perpendicular to the principal surface (S1) of the substrate (1).

24 Claims, 15 Drawing Sheets

(56) References Cited

FOREIGN PATENT DOCUMENTS

| | | | |
|---|---|---|---|
| JP | 2004039500 | A | 2/2004 |
| JP | 2006278257 | A | 10/2006 |
| JP | 2007115679 | A | 5/2007 |
| JP | 2020136260 | A | 8/2020 |
| JP | 2021039183 | A | 3/2021 |
| WO | 0139554 | A1 | 5/2001 |
| WO | 2020162355 | A1 | 8/2020 |

* cited by examiner

LIGHT EMITTING APPARATUS, DISPLAY APPARATUS, PHOTOELECTRIC CONVERSION APPARATUS, ELECTRONIC DEVICE, ILLUMINATION APPARATUS, AND MOVING OBJECT

CROSS-REFERENCE TO RELATED APPLICATIONS

This application is a Continuation of International Patent Application No. PCT/JP2022/015500, filed Mar. 29, 2022, which claims the benefit of Japanese Patent Application No. 2021-067636, filed Apr. 13, 2021 and Japanese Patent Application No. 2022-018102, filed Feb. 8, 2022, both of which are hereby incorporated by reference herein in their entirety.

TECHNICAL FIELD

The present invention relates to a light emitting apparatus, a display apparatus, a photoelectric conversion apparatus, an electronic device, an illumination apparatus, and a moving object.

BACKGROUND ART

An organic EL element is a light emitting element including a pair of electrodes and an organic compound layer having a light emitting layer disposed between the pair of electrodes. By taking advantage of excellent features, that is, surface emission characteristics, light weight, and visibility, use of organic EL elements as light emitting apparatuses, such as thin-screen displays, luminaires, head mounted displays, and print head light sources of electrophotographic printers, has been proceeding.

Incidentally, at the time of using an organic EL element, mostly light emitted in a front direction of the organic EL element is used, so it is important to increase the intensity of light that is emitted in the front direction with respect to the organic EL element.

PTL 1 describes that an organic EL element has a resonator structure and the thickness of the resonator structure is adjusted such that light with a peak wavelength of the spectrum of light intended to be extracted is intensified. With the configuration of PTL 1, light with a peak wavelength of the spectrum of a light emitting material is intensified when emitted in a normal direction of a light emitting layer, with the result that the intensity of light that is emitted in the front direction improves.

On the other hand, PTL 2 describes a technology for, in order to improve misregistration depending on a viewing direction of a display apparatus, increasing an optical distance between a light emitting layer and a reflective film of an organic EL element as compared to a peak value of the emission spectrum of light that the light emitting layer produces.

CITATION LIST

Patent Literature

PTL 1 International Publication No. 01/039554

PTL 2 Japanese Patent Laid-Open No. 2007-115679

In PTL 2, the intensity of light that is emitted in a direction inclined with respect to the front direction of the organic EL element is higher than the intensity of light that is emitted in the front direction. Therefore, the intensity of light that is emitted in the front direction is not so high. With PTL 1 as well, improvement of the intensity of light that is emitted in the front direction is not yet enough. In other words, hitherto, there is an inconvenience that the intensity of light that is emitted in the front direction of the light emitting apparatus is not yet sufficiently high.

SUMMARY OF INVENTION

In view of the above-described inconvenience, it is an object of the present invention to increase the intensity of light that is emitted in a front direction.

A light emitting apparatus according to one aspect of the present invention includes an organic light emitting element disposed on a principal surface of a substrate. The organic light emitting element includes a first electrode, a second electrode, and an organic layer including a light emitting layer and interposed between the first electrode and the second electrode, a light extraction structure disposed on a light emission side of the organic layer, and a reflection surface disposed so as to sandwich the organic layer with the light extraction structure. The light emitting layer contains a first light emitting material. An optical distance between the light emitting layer and the reflection surface is a value with which, where a wavelength included in a peak wavelength range of a PL spectrum of the first light emitting material is a first wavelength, light with the first wavelength, traveling through the light emitting layer in a first direction that intersects with a normal direction of the principal surface of the substrate, and light with the first wavelength, traveling through the light emitting layer in a second direction that intersects with the normal direction of the principal surface of the substrate and that is different from the first direction, both are intensified. An absolute value of an angle formed between the normal direction of the principal surface of the substrate and the first direction and an absolute value of an angle formed between the normal direction of the principal surface of the substrate and the second direction are the same. The light extraction structure has a first inclined portion and a second inclined portion. First incident light that is light with the first wavelength, traveling through the light emitting layer in the first direction and having reached the first inclined portion, is refracted at the first inclined portion and emitted in a third direction from the light extraction structure. Second incident light that is light with the first wavelength, traveling through the light emitting layer in the second direction and having reached the second inclined portion, is refracted at the second inclined portion and emitted in a fourth direction from the light extraction structure. An absolute value of an angle formed between the normal direction of the principal surface of the substrate and the third direction and an absolute value of an angle formed between the normal direction of the principal surface of the substrate and the fourth direction both are greater than or equal to zero degrees and less than or equal to five degrees.

Further features of the present invention will become apparent from the following description of exemplary embodiments with reference to the attached drawings.

DESCRIPTION OF EMBODIMENTS

Hereinafter, embodiments of the present invention will be described with reference to the attached drawings. In the following description and the drawings, like reference signs are assigned to common components over a plurality of the drawings. Therefore, common components will be described with reference to a plurality of drawings, and the description of components with common reference signs will not be repeated as needed.

In the specification, the words indicating arrangement, such as “up”, “down”, and the like are used for the sake of convenience to describe the positional relationship among components with reference to the drawings. The positional relationship among components changes as needed in accordance with a direction in which the components are drawn. Therefore, not limited to the words described in the specification, the words may be appropriately replaced depending on situations. The words “up” and “down” do not limit the positional relationship among component elements to directly above or directly below and direct contact. For example, for the expression “member B on member A” does not need to indicate that member B is formed on member A and is in direct contact with member A, and the configuration in which another component element is provided between member A and member B is not excluded.

First Embodiment

Configuration of Light Emitting Apparatus

Figure 1:
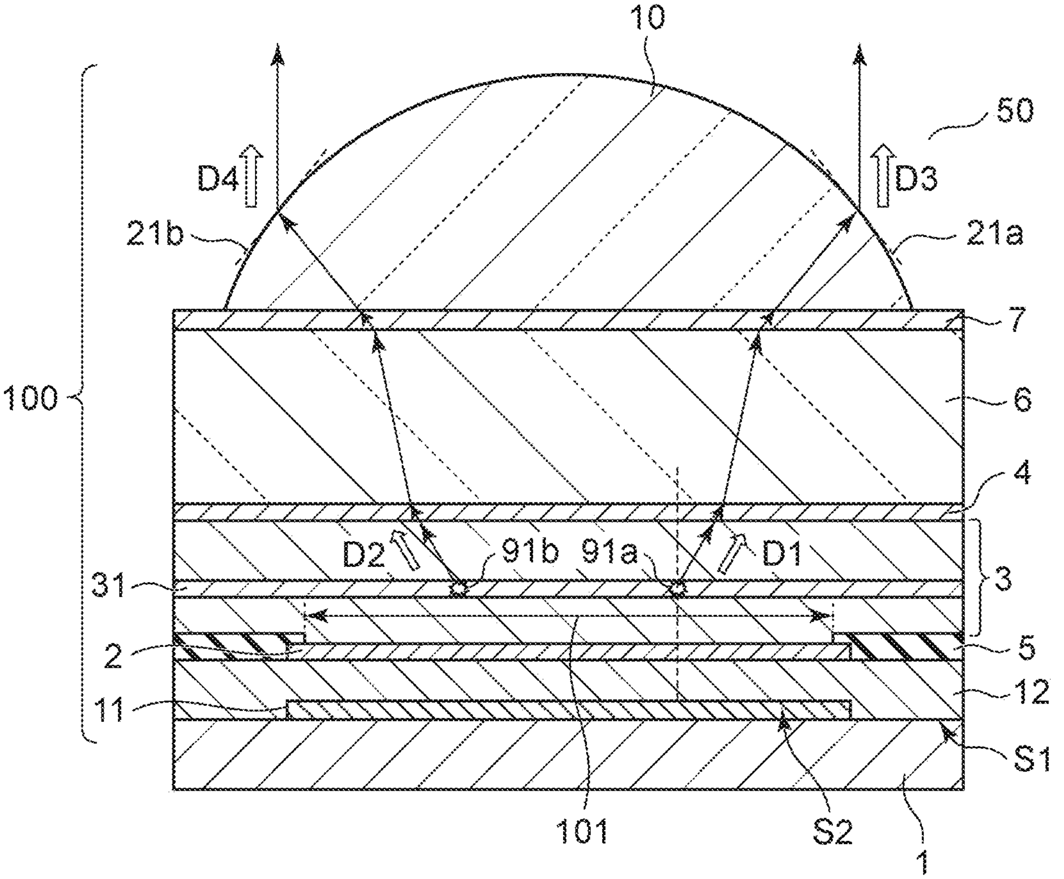
FIG. 1 is a schematic sectional view of an organic light emitting element of a light emitting apparatus according to a first embodiment.

The configuration of a light emitting apparatus according to a first embodiment of the present invention will be described. FIG. 1 is a schematic sectional view of an organic light emitting element of the light emitting apparatus according to the first embodiment.

An organic light emitting element 100 has such a structure that a reflective layer 11, a lower electrode 2 that is a first electrode, an organic compound layer 3 that is an organic layer, an upper electrode 4 that is a second electrode, and a light extraction structure 10 are disposed on a substrate 1 in this order from a principal surface S1 side (principal surface side) of the substrate 1. In other words, the reflective layer 11 is disposed on the principal surface S1 of the substrate 1, the lower electrode 2 is disposed on the reflective layer 11, the organic compound layer 3 is disposed on the lower electrode 2, the upper electrode 4 is disposed on the organic compound layer 3, and the light extraction structure 10 is disposed on the upper electrode 4. The organic compound layer 3 includes a light emitting layer 31 and is sandwiched between the lower electrode 2 and the upper electrode 4.

The substrate 1 is made of a material capable of supporting the lower electrode 2, the organic compound layer 3, the upper electrode 4, and the like formed thereon, and is suitably a glass substrate, a plastic substrate, a semiconductor substrate, such as a silicon substrate, or the like. A switching element, such as a transistor (not shown), a wire, an interlayer dielectric film, or the like may be formed on or in the substrate 1. The transistor may be a MOS transistor formed in a semiconductor substrate or a TFT.

The lower electrode 2 may be made of a transparent conductive oxide, such as ITO and IZO, a metal material, such as Al and Ag, or an alloy obtained by adding Si, Cu, Ni, Nd, Ti, or the like to the transparent conductive oxide or the metal material. When a metal material is used for the lower electrode 2, a barrier layer may be provided on the surface on the light emission side. The material of the barrier layer may be a metal, such as Ti, W, Mo, and Au, or an alloy of the metal, or a transparent conductive oxide, such as ITO and IZO.

The organic compound layer 3 is disposed on the lower electrode 2 and may be formed by a vapor deposition method, a spin coating method, an ink-jet method, or the like. The organic compound layer 3 includes the light emitting layer 31 made of an organic material. The organic compound layer 3 may be made up of a plurality of layers and may include, for example, a hole injection layer, a hole transport layer, an electron block layer, the light emitting layer 31, a hole block layer, an electron transport layer, an electron injection layer, and a charge generation layer. The configuration of the organic compound layer 3 is not limited. The organic compound layer 3 may further include a layer other than these layers or does not need to include at least one layer other than the light emitting layer 31. Each of the layers that make up the organic compound layer 3 may be made up of a plurality of layers, or the light emitting layer 31 may include a first light emitting layer and a second light emitting layer. When the light emitting layer 31 includes a plurality of light emitting layers, the light emitting layers may be laminated adjacent to each other so as to be in contact with each other or may be spaced apart via another layer.

The light emitting layer 31 contains a first light emitting material. The first light emitting material is, for example, any one of a blue light emitting material, a green light emitting material, and a red light emitting material. When the light emitting layer 31 includes a plurality of light emitting layers, one light emitting layer may contain one type of light emitting material. Alternatively, the light emitting layer 31 may contain two or more types of light emitting materials in one light emitting layer.

The light emitting material contained in the light emitting layer 31 has a photoluminescence (PL) spectrum that is wavelength dependence of light emission intensity for excitation light. The PL spectrum of a light emitting material has a spectrum shape in which light emission intensity is locally maximum at a wavelength in a predetermined wavelength range. In the specification, where a wavelength at which light emission intensity is locally maximum in the PL spectrum is a peak wavelength $\lambda_p$ (nm), a range greater than or equal to ($\lambda_p$−5) nm and less than or equal to ($\lambda_p$+5) nm is a peak wavelength range. When there are two or more wavelengths at which light emission intensity is locally maximum in the PL spectrum, that is, when there are a primary peak wavelength at which light emission intensity is maximum and a secondary peak wavelength at which light emission intensity is the second greatest local maximum value, any one of the wavelengths may be set for a peak wavelength. In the present embodiment, the primary peak wavelength that is a wavelength at which light emission intensity is maximum in the PL spectrum is set for the peak wavelength.

The upper electrode 4 is disposed on the organic compound layer 3 and has translucency so as to transmit light emitted from the light emitting layer 31. The upper electrode 4 may be made of a translucent reflection material having a property to transmit part of light having reached its surface and reflects the other part (that is, translucent reflection property). The material of the upper electrode 4 is, for example, a translucent reflection material made up of a thin film of a transparent conductive oxide, such as ITO and IZO, an element metal, such as aluminum, silver, and gold, an alkali metal, such as lithium and cesium, an alkaline earth metal, such as magnesium, calcium, and barium, or an alloy material containing at least any one of these metal materials. A translucent reflection material is desirably an alloy mainly containing magnesium or silver. As long as the upper electrode 4 has a desired transmittance, the upper electrode 4 may be a laminate of the above-described materials.

Holes injected from a positive electrode (anode) and electrons injected from a negative electrode (cathode) recombine in the organic compound layer 3 to emit light from the light emitting layer 31. In the present embodiment, the lower electrode 2 may be a positive electrode and the upper electrode 4 may be a negative electrode, or the lower electrode 2 may be a negative electrode and the upper electrode 4 may be a positive electrode.

The reflective layer 11 is provided on a light reflection side of the organic compound layer 3 in the organic light emitting element 100. Here, the light reflection side is a side adjacent to the lower electrode 2 when viewed from the organic compound layer 3. The reflective layer 11 is preferably made of a high-reflectance material, and is preferably made of a metal material, such as Al and Ag, or an alloy obtained by adding Si, Cu, Ni, Nd, Ti, or the like to the metal material. The reflective layer 11 includes a reflection surface S2. Here, an upper surface of the reflective layer 11 is the reflection surface S2. The reflection surface S2 may be a lower surface of the reflective layer 11 or may be disposed in the reflective layer 11. The reflection surface S2 is disposed across the organic compound layer 3 from the light extraction structure 10. In other words, the organic compound layer 3 is disposed between the reflection surface S2 and the light extraction structure 10.

When the lower electrode 2 is made of a high-reflectance material, the lower electrode 2 may also serve as the reflective layer 11. A transparent conductive oxide, such as ITO and IZO, may be provided in contact with the reflective layer 11.

An optical interference layer 12 that adjusts an optical distance between the reflection surface S2 and the light emitting layer 31 may be provided between the reflection surface S2 and the lower electrode 2. The optical interference layer 12 is preferably made of a material having highly optical transparency in a visible light range, that is, an inorganic material, such as silicon nitride (SiN), silicon oxynitride (SiON), and silicon oxide (SiO), or an organic material, such as acrylic resin, epoxy resin, and silicon resin, or the like. When the optical interference layer 12 is provided, the lower electrode 2 preferably has a high light transmittance and is preferably a transparent conductive oxide, such as ITO and IZO.

The light extraction structure 10 is provided on the light emission side of the upper electrode 4. Here, the light emission side is a side adjacent to the upper electrode 4 when viewed from the organic compound layer 3.

The light extraction structure 10 has an inclined portion 21. As will be described in detail later, the inclined portion 21 is a portion where, when light with a first wavelength $\lambda_1$, traveling through the light emitting layer 31 in a direction that makes an angle θ1 with a normal direction of the principal surface S1 of the substrate 1, the light is refracted at the inclined portion 21 and emitted in a direction substantially perpendicular to the principal surface S1 of the substrate 1. The light extraction structure 10 has a plurality of inclined portions and has at least a first inclined portion 21*a* and a second inclined portion 21*b*.

Light with the first wavelength $\lambda_1$, traveling through the light emitting layer 31 in a first direction D1, enters the first inclined portion 21*a* as first incident light to be refracted and is emitted in a third direction D3. Light with the first wavelength $\lambda_1$, traveling through the light emitting layer 31 in a second direction D2, enters the second inclined portion 21*b* as second incident light to be refracted and is emitted in a fourth direction D4. An angle that the first direction D1 and the second direction D2 each make with the normal direction of the principal surface S1 of the substrate 1 is $\theta_1$ (where $\theta_1$ is greater than zero degrees). In other words, the first direction D1 and the second direction D2 intersect with the normal direction of the principal surface S1 of the substrate 1, and the first direction D1 and the second direction D2 are different directions. The absolute value of the angle formed between the normal direction of the principal surface S1 of the substrate 1 and the first direction D1 is the same as the absolute value of the angle formed between the normal direction of the principal surface S1 of the substrate 1 and the second direction D2. The third direction D3 and the fourth direction D4 each are a direction substantially perpendicular to the principal surface S1 of the substrate 1. Here, the direction substantially perpendicular to the principal surface S1 of the substrate 1 means a direction that makes an angle greater than or equal to zero degrees and less than or equal to five degrees with a direction perpendicular to the principal surface S1 of the substrate 1.

A light emitting portion 50 is provided on the light emission side of the light extraction structure 10. The light emitting portion 50 is a region through which light emitted from the light extraction structure 10 travels. The refractive index of the light emitting portion 50 and the refractive index of the light extraction structure 10 are different from each other. Thus, when light enters the inclined portion 21 of the light extraction structure 10 at an angle other than 90 degrees, the light is refracted at the inclined portion 21, and the traveling direction of the light changes. The refractive index of the light emitting portion 50 just needs to have a difference from the refractive index of the light extraction structure 10. The refractive index of the light emitting portion 50 may be greater or less than the refractive index of the light extraction structure 10. The difference between the refractive index of the light emitting portion 50 and the refractive index of the light extraction structure 10 is preferably greater than or equal to 0.1, more preferably greater than or equal to 0.3, and further preferably greater than or equal to 0.5.

The light extraction structure 10 is preferably made of a material having high optical transparency in the visible light range. Examples of the material of the light extraction structure 10 include an organic material, such as acrylic resin, epoxy resin, and silicon resin, and an inorganic material, such as silicon nitride (SiN), silicon oxynitride (SiON), and silicon oxide (SiO). The light extraction structure 10 preferably has a high light transmittance over all the visible light range (greater than or equal to 380 nm and less than or equal to 780 nm). Alternatively, the light extraction structure 10 may have a high light transmittance in a partial wavelength range of the visible light range.

The light emitting portion 50 is preferably made of a material having high optical transparency. The material of the light emitting portion 50 may be a solid material or may be a gaseous material. Examples of the gaseous material include air, oxygen, nitrogen, and carbon dioxide. Examples of the solid material include an organic material, such as acrylic resin, epoxy resin, and silicon resin, and an inorganic material, such as silicon nitride (SiN), silicon oxynitride (SiON), and silicon oxide (SiO). Of these, particularly, the gaseous material is preferable because a difference in refractive index between the light extraction structure 10 and the light emitting portion 50 is easily increased. The light emitting portion 50 preferably has a high light transmittance over all the visible light range (greater than or equal to 380 nm and less than or equal to 780 nm). Alternatively, the light emitting portion 50 may have a high light transmittance in a partial wavelength range of the visible light range.

Feature of Light Emitting Apparatus According to First Embodiment

Next, one feature of the light emitting apparatus according to the first embodiment and its advantage will be described with reference to FIGS. 2 to 5.

(1) Optical Interference Condition

Figure 2:
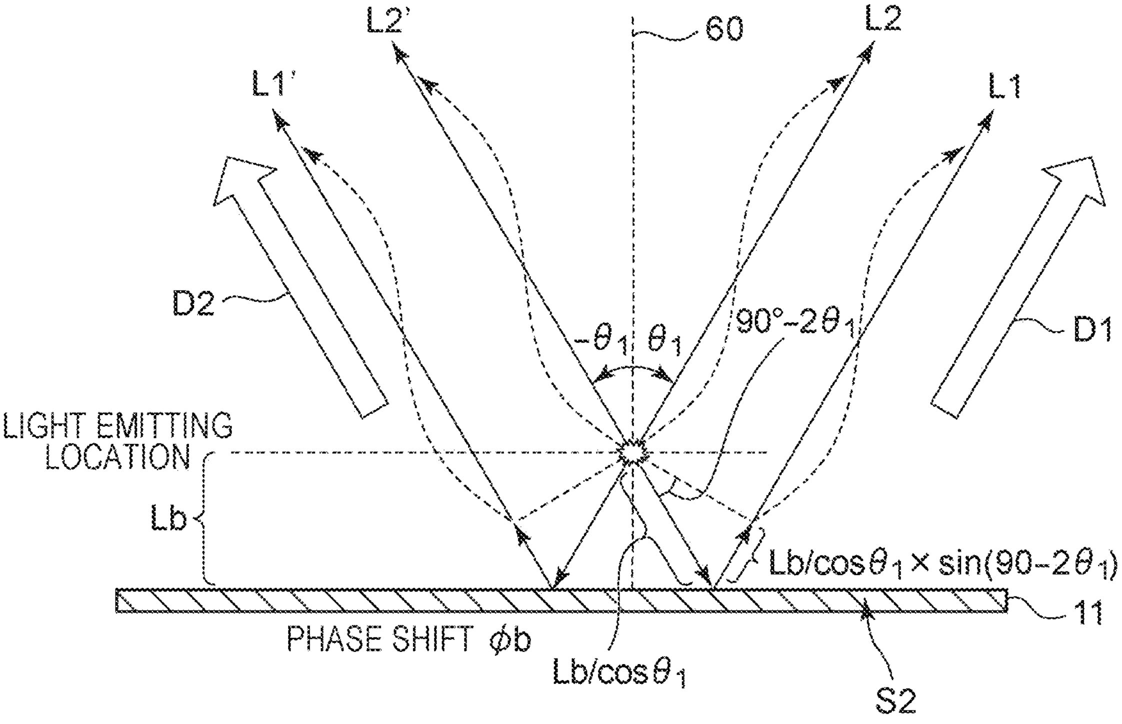
FIG. 2 is a schematic sectional view for illustrating optical interference in the organic light emitting element of the light emitting apparatus according to the first embodiment.

FIG. 2 is a schematic sectional view for illustrating optical interference in the organic light emitting element of the light emitting apparatus according to the first embodiment. An optical condition on a light emitting location of the light emitting layer 31 and a location of the reflection surface S2 in the organic light emitting element according to the present embodiment will be described with reference to FIG. 2.

Light produced in the light emitting layer 31 includes first light L1 and second light L2. The first light L1 is light that is emitted from the light emitting layer 31 toward the first electrode (lower electrode 2), reflected on the reflection surface S2, and travels in the first direction D1 toward the second electrode (upper electrode 4). In other words, the first light L1 is light that is emitted from the light emitting layer 31, travels to the light reflection side, reflects on the reflection surface S2, and, after reflection, travels to the light emission side and is extracted from the light extraction structure 10 to the light emitting portion 50. The second light L2 is light that is emitted in the first direction D1 from the light emitting layer 31 toward the second electrode (upper electrode 4). In other words, the second light L2 is light that is directly emitted from the light emitting layer 31 to the light emission side and travels in the first direction D1. The first light L1 and the second light L2 are rays of light with the first wavelength $\lambda_1$. In the present embodiment, an optical distance Lb between the light emitting layer 31 and the reflection surface S2 is adjusted such that the first light L1 and the second light L2 constructively interfere with each other. Here, the first wavelength $\lambda_1$ is a wavelength included in a peak wavelength range (greater than or equal to $(\lambda_{p1}-5)$ nm and less than or equal to $(\lambda_{p1}+5)$ nm) of the PL spectrum of the first light emitting material contained in the light emitting layer 31. The peak wavelength of the PL spectrum of the first light emitting material contained in the light emitting layer 31 is assumed as $\lambda_{p1}$ (nm). The first direction D1 is a direction inclined from the normal direction of the principal surface S1 of the substrate 1. The angle $\theta_1$ formed between the normal direction of the principal surface S1 of the substrate 1 and the first direction D1 is greater than zero degrees and less than 90 degrees.

Rays of light with the first wavelength $\lambda_1$, traveling through the light emitting layer 31 in the second direction D2, are also configured to constructively interfere with each other as in the case of the first direction D1. Specifically, first 'light L1' and second 'light L2' are configured to constructively interfere with each other. Here, the first 'light L1' is light that is emitted from the light emitting layer 31 toward the first electrode (lower electrode 2), reflected on the reflection surface S2, and travels in the second direction D2 toward the second electrode (upper electrode 4). The second 'light L2' is light that is emitted in the second direction D2 from the light emitting layer 31 toward the second electrode (upper electrode 4).

The optical distance Lb between the light emitting layer 31 and the reflection surface S2 is adjusted so as to satisfy the following expression (1). When the following expression (1) is satisfied, the first light L1 and the second light L2 constructively interfere with each other, and light with the first wavelength $\lambda_1$, traveling through the light emitting layer 31 in the first direction D1, is intensified. The first 'light L1' and the second 'light L2' constructively interfere with each other, and light with the first wavelength $\lambda_1$, traveling through the light emitting layer 31 in the second direction D2, is intensified. Not only the optical distance Lb is adjusted but also a phase shift φb at the reflection surface S2 may be adjusted.

$$Lb/\cos\theta_1\times(1+\sin(90-2\theta_1))=\lambda_1\times(m-\varphi b/360) \quad (1)$$

In the expression (1), Lb denotes the optical distance (in nm) between the light emitting layer 31 and the reflection surface S2, and 01 denotes the angle (in degree) formed between the normal direction of the principal surface S1 of the substrate 1 and the first direction D1. $\lambda_1$ denotes a wavelength (in nm) included in the peak wavelength range of the PL spectrum of the first light emitting material contained in the light emitting layer 31, and φb denotes a phase shift (in degree) at the time of reflecting on the reflection surface S2. m is an integer greater than or equal to zero.

Figure 3:
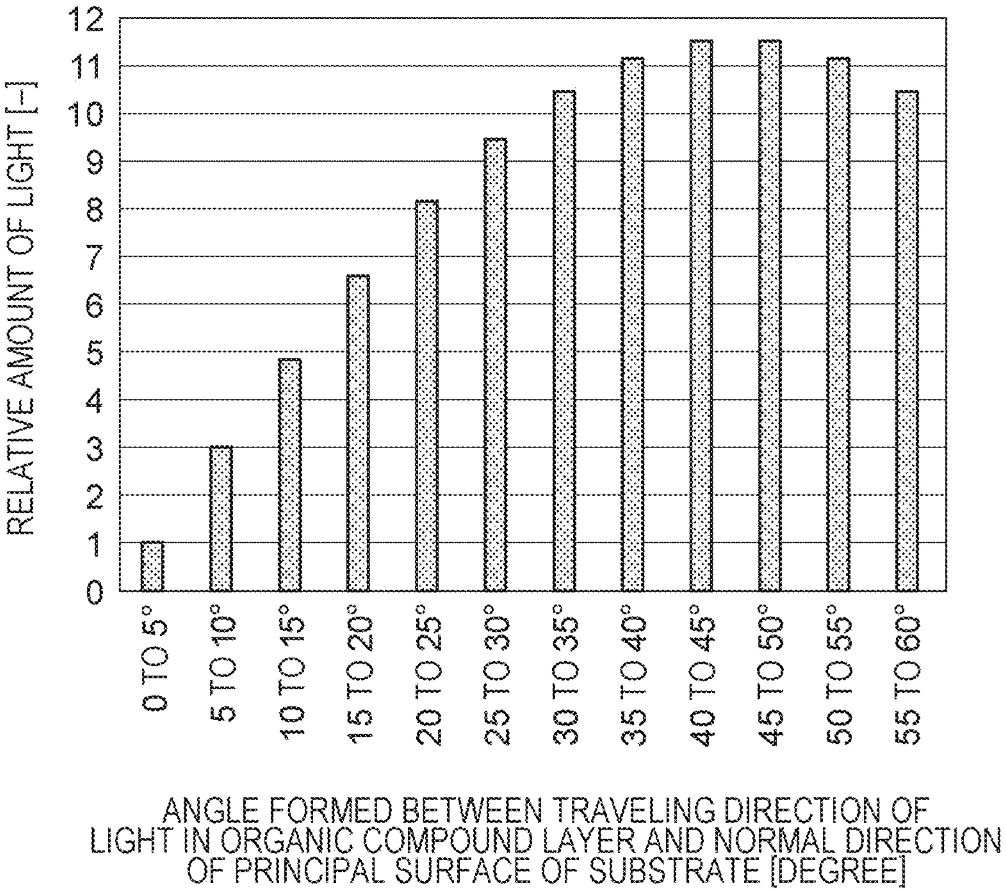
FIG. 3 is a schematic diagram that shows an angular distribution of the amount of light in an organic compound layer of the organic light emitting element.

Incidentally, FIG. 3 shows an angular distribution of the amount of light in an organic compound layer of a general organic light emitting element. FIG. 3 shows the total amount of light beam radiated at each solid angle for light in a case where light emission in the organic compound layer has a constant luminance. In FIG. 3, a numeric value range of solid angle is converted into a numeric value range of an angle formed between a traveling direction of light and a normal direction, and a relative amount of light is shown where the amount of light in the range of zero degrees to five degrees is one. As shown in FIG. 3, light traveling at a wider angle has a greater amount of light than light traveling at an angle of zero degrees to five degrees, that is, light traveling substantially perpendicularly to the principal surface of the substrate. Although not shown in FIG. 3, the amount of light traveling in a direction of which the angle formed with the normal direction is greater than zero degrees is greater than the amount of light traveling in a direction of which the angle formed with the normal direction is zero degrees. The amount of light increases with an increase in solid angle. In this way, it appears that, for light produced from the light emitting layer, light traveling in a direction inclined with respect to the normal direction has a greater amount of light than light traveling substantially perpendicularly to the principal surface of the substrate.

Here, light with a wavelength included in the peak wavelength range of the PL spectrum of the first light emitting material is particularly high-intensity light, of light emitted from the first light emitting material. Therefore, when light with the wavelength travels through the organic compound layer 3 in the normal direction of the principal surface S1 of the substrate 1, the amount of light can be increased when rays of the light constructively interfere with each other at the time of traveling in a direction inclined with respect to the normal direction than when the light constructively interferes with reflected light on the reflection surface S2. In other words, in the present embodiment, when rays of light with a wavelength included in the peak wavelength range of the PL spectrum of the first light emitting material constructively interfere with each other at the time of traveling in a direction inclined with respect to the normal direction, light emitted from the light emitting layer 31 is more intensified.

Figure 4:
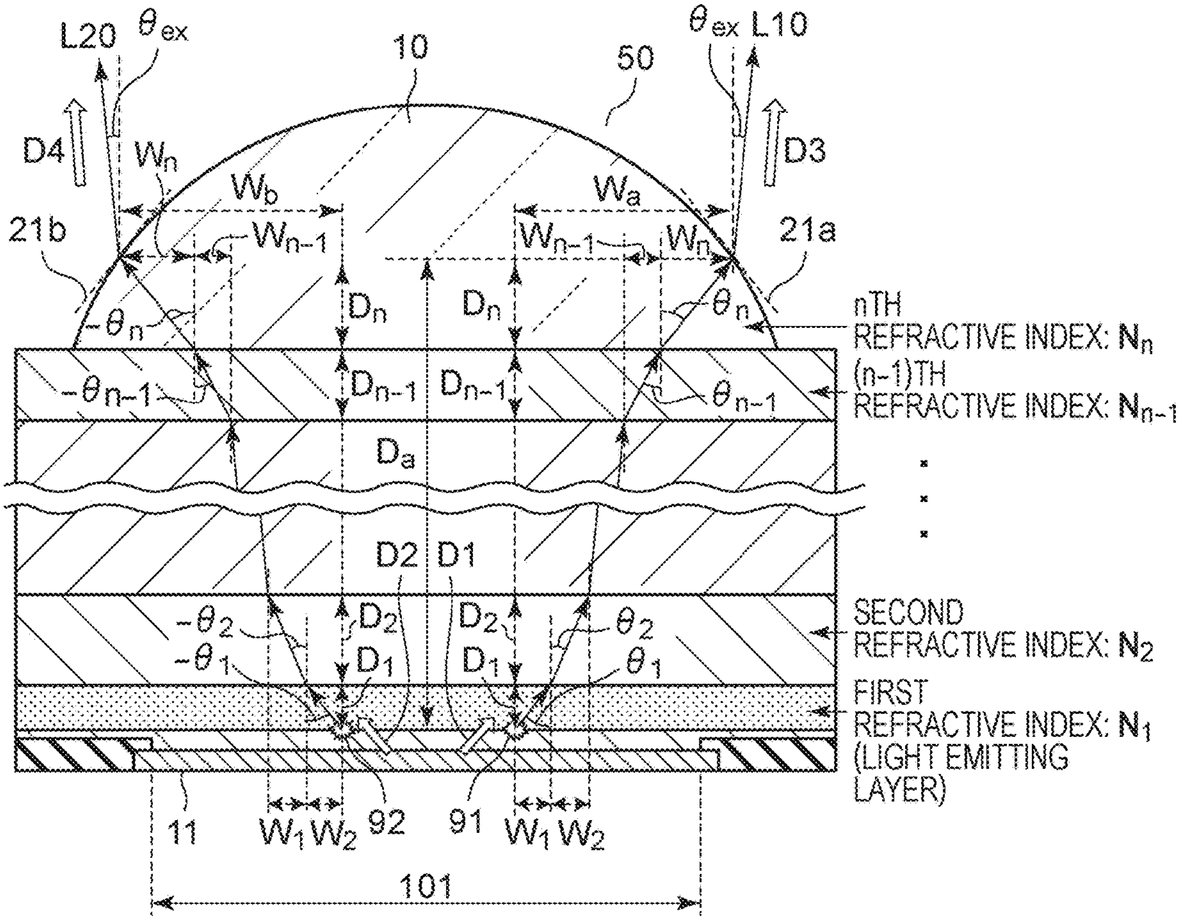
FIG. 4 is a schematic sectional view that shows a positional relationship between the light emitting layer and the light extraction structure according to the first embodiment.

(2) Positional Relationship Between Light Emitting Point in Light Emitting Layer and Inclined Portion of Light Extraction Structure FIG. 4 is a schematic sectional view that shows a positional relationship between the light emitting layer and the light extraction structure. More specifically, FIG. 4 shows a case where rays of light with the first wavelength $\lambda_1$, respectively traveling through the light emitting layer 31 in the first direction D1 and the second direction D2, are emitted in the third direction D3 and the fourth direction D4 at the inclined portions 21 of the light extraction structure 10. The positional relationship between a light emitting point and the inclined portion 21 in the organic light emitting element included in the light emitting apparatus according to the present embodiment will be described with reference to FIG. 4.

As described above, the inclination angle of the first inclined portion 21*a* is set such that, when light with the first wavelength $\lambda_1$, traveling through the light emitting layer 31 in the first direction D1, enters the first inclined portion 21*a*, the light is refracted at the first inclined portion 21*a* and emitted in the third direction D3 from the light extraction structure 10. The inclination angle of the second inclined portion 21*b* is set such that, when light with the first wavelength $\lambda_1$, traveling through the light emitting layer 31 in the second direction D2, enters the second inclined portion 21*b*, the light is refracted at the second inclined portion 21*b* and emitted in the fourth direction D4 from the light extraction structure 10. In the following description, light with the first wavelength $\lambda_1$, traveling through the light emitting layer 31 in the first direction D1, enters the first inclined portion 21*a* and is emitted is referred to as light L10. Light with the first wavelength $\lambda_1$, traveling through the light emitting layer 31 in the second direction D2, enters the second inclined portion 21*b* and is emitted, is referred to as light L20. The light L10 and the light L20 both are included in light that travels through the light emitting layer 31 in a direction that makes an angle of G1 with the normal direction of the principal surface S1. Here, the light emitting point of the light L10 in the light emitting layer 31 is referred to as first light emitting point 91*a*, and the light emitting point of the light L20 in the light emitting layer 31 is referred to as second light emitting point 91*b*.

At this time, a vertical distance $D_a$ and a horizontal distance $W_a$ between the first light emitting point 91*a* and a reach position of the light L10 at the first inclined portion 21*a* (hereinafter, referred to as light extraction point) are respectively expressed by the following expression (2) and expression (3).

$$D_a=D_1+D_2+\ldots+D_{n-1}+D_n \tag{2}$$

$$W_a=W_1+W_2+\ldots+W_{n-1}+W_n \tag{3}$$

Furthermore, the expression (3) is converted to the following expression (3)'.

$$W_a=D_1\times\tan\theta_1+D_2\times\tan(\arcsin(\sin\theta_1\times N_1/N_2))+\ldots+D_{n-1}\times\tan(\arcsin(\sin\theta_1\times N_1/N_{n-1}))+D_n\times\tan(\arcsin(\sin\theta_1\times N_1/N_n)) \tag{3'}$$

Here, when the number of component members present from the light emitting layer 31 to the light extraction point in the light extraction structure 10 is n, it is assumed that the light emitting layer 31 is the first component member and the light extraction structure 10 is the nth component member from the light emitting layer 31.

$D_1$, $D_2$, . . . , $D_{n-1}$, and $D_n$ respectively correspond to the thicknesses of the component members present in order from the light emitting layer 31 to the light extraction point of the light extraction structure 10. In other words, $D_1$ is the thickness of the light emitting layer 31 that is the first component member, $D_2$ is the thickness of the second component member, and $D_n$ is the thickness of the light extraction structure 10 that is the nth component member from the lower surface to the light extraction point. Therefore, the vertical distance $D_a$ is the total sum of $D_1$, $D_2$, . . . , $D_{n-1}$, and $D_n$, so the expression (2) holds.

$W_1$, $W_2$, . . . , $W_{n-1}$, and $W_n$ respectively correspond to horizontal distances of parts through which light passes in order, of the component members present from the light emitting layer 31 to the light extraction point of the light extraction structure 10. Therefore, the horizontal distance $W_a$ is the total sum of $W_1$, $W_2$, . . . , $W_{n-1}$, and $W_n$, so the expression (3) holds. Here, a horizontal distance of each of parts of the component members through which light passes is obtained from the angle $\theta_1$ formed between the first direction D1 and the normal direction of the principal surface S1 of the substrate 1, the refractive index $N_1$ of the light emitting layer 31, the refractive indices $N_2$ to $N_n$ of the component members, and the thicknesses $D_1$ to $D_n$ of the component members.

A vertical distance $D_b$ and a horizontal distance $W_b$ between the second light emitting point 91*b* and a reach position of the light L20 at the second inclined portion 21*b*

(light extraction point) can also be similarly obtained. In the present embodiment, the positional relationship between the first light emitting point 91*a* and the first inclined portion 21*a* and the positional relationship between the second light emitting point 91*b* and the second inclined portion 21*b* may be the same or may be different. When the positional relationships are the same, Da=db holds, and Wa=Wb holds. The positional relationship between the first light emitting point 91*a* and the first inclined portion 21*a* and the positional relationship between the second light emitting point 91*b* and the second inclined portion 21*b* may be line-symmetric with respect to a normal line of the principal surface S1, passing through the center of the light emission area 101.

Thus, the light L10 emitted from the first light emitting point 91*a* and traveling in the first direction D1 enters the first inclined portion 21*a* of the light extraction structure 10, and the light L20 emitted from the second light emitting point 91*b* and traveling in the second direction D2 enters the second inclined portion 21*b* of the light extraction structure 10.

(3) Inclination Angle of Inclined Portion of Light Extraction Structure

Figure 5:
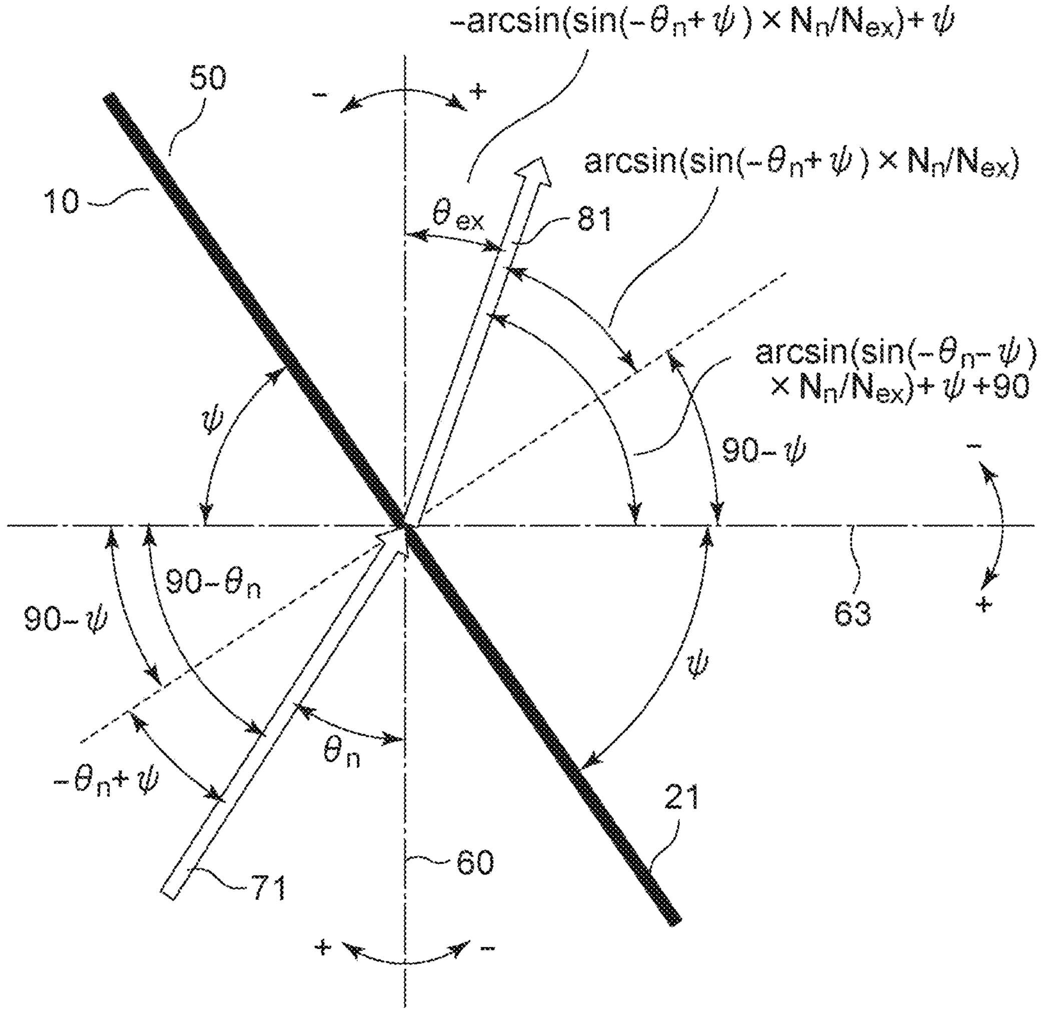
FIG. 5 is a schematic diagram that shows an inclination angle of an inclined portion and a traveling direction of light at the inclined portion.

FIG. 5 shows an inclination angle ψ of the inclined portion 21, the traveling direction of light that reaches the inclined portion 21, and the traveling direction of light that is emitted from the inclined portion 21, at the inclined portion 21 of the light extraction structure 10. The inclination angle ψ of the inclined portion 21 of the organic light emitting element according to the present embodiment will be described with reference to FIG. 5. FIG. 5 is an enlarged view of the first inclined portion 21*a* of the light extraction structure 10.

The inclination angle ψ of the first inclined portion 21*a* is set such that, when light traveling through the light emitting layer 31 in the first direction D1 reaches the first inclined portion 21*a*, the light is refracted at the first inclined portion 21*a* and emitted in the third direction D3 from the light extraction structure 10. The inclination angle ψ of the second inclined portion 21*b* is set such that, when light traveling through the light emitting layer 31 in the second direction D2 reaches the second inclined portion 21*b*, the light is refracted at the second inclined portion 21*b* and emitted in the fourth direction D4 from the light extraction structure 10. Here, where light that enters the first inclined portion 21*a* when light traveling through the light emitting layer 31 in the first direction D1 reaches the first inclined portion 21*a* is referred to as incident light 71 and light that is emitted from the first inclined portion 21*a* is referred to as emission light 81, the inclination angle of the first inclined portion 21*a* will be studied.

An angle $\theta_{ex}$ formed between the third direction D3 that is the traveling direction of the emission light 81 and the normal direction of the principal surface S1 and the angle ψ of the first inclined portion 21*a* are in a relationship that satisfies the following expression (4) and expression (5) from Snell formula.

$$\theta_n=\arcsin(\sin\theta_1'\times N_1/N_n) \quad (4)$$

$$\theta_{ex}=-\arcsin(\sin(-\theta_n+\psi)\times N_n/N_{ex})+\psi \quad (5)$$

In the expression (4) and expression (5), $N_1$ denotes the refractive index of the light emitting layer 31, $N_n$ denotes the refractive index of the light extraction structure 10, and $N_{ex}$ denotes the refractive index of the light emitting portion 50. On denotes an angle (degrees) formed between the traveling direction of the incident light 71 that enters the first inclined portion 21*a* and the normal direction of the principal surface S1, and $\theta_1'$ denotes an angle (degrees) formed between the first direction D1 that is the traveling direction in the light emitting layer 31, of the incident light 71 that enters the first inclined portion 21*a*, and the normal direction of the principal surface S1. $\theta_{ex}$ denotes an angle (degrees) formed between the third direction D3 that is the traveling direction of the emission light 81 that is emitted from the inclined portion 21 and the normal direction of the principal surface S1, and ψ denotes an angle (degrees) formed between a part of the first inclined portion 21*a* where the incident light 71 enters and a straight line 63 parallel to the principal surface S1. In the expression (4) and expression (5), 6n, $\theta_1'$, and $\theta_{ex}$ have a positive angle in a clockwise direction and a negative angle in a counterclockwise direction around a normal line 60 of the principal surface S1 as an initial line, and ψ has a positive angle in a clockwise direction and a negative angle in a counterclockwise direction about a straight line 63 parallel to the principal surface S1 as an initial line.

In the present embodiment, the angle ψ of the first inclined portion 21*a* is set such that the angle $\theta_{ex}$ formed between the third direction D3 that is the traveling direction of the emission light 81 and the normal direction of the principal surface S1 is substantially zero degrees. More specifically, the angle ψ of the first inclined portion 21*a* is set such that the angle $\theta_{ex}$ is greater than or equal to −5 degrees and less than or equal to five degrees. The angle ψ of the first inclined portion 21*a* is set such that the absolute value of the angle $\theta_{ex}$ is greater than or equal to zero degrees and less than or equal to five degrees. With such a structure, the incident light 71 is refracted at the first inclined portion 21*a*, and becomes the emission light 81 that travels in a direction substantially perpendicular to the principal surface S1 of the substrate 1. Here, the first inclined portion 21*a* has been described; however, the same applies to the second inclined portion 21*b*.

As described up to here, the following configuration adopts the following configuration in the present embodiment. Initially, the optical distance Lb between the light emitting layer 31 and the reflection surface S2 is adjusted such that rays of light with a wavelength included in the peak wavelength range of the PL spectrum of the first light emitting material constructively interfere with each other at the time of traveling in a direction inclined with respect to the normal direction due to optical interference at the light emitting layer 31 and the reflection surface S2. In this way, rays of light emitted from the light emitting layer 31 are respectively further intensified in the first direction D1 and the second direction D2. Then, light traveling in the first direction D1 enters the first inclined portion 21*a* of the light extraction structure 10, and light traveling in the second direction D2 enters the second inclined portion 21*b* of the light extraction structure 10. In other words, light traveling in the first direction D1 and intensified heads toward the first inclined portion 21*a* of the light extraction structure 10, and light traveling in the second direction D2 and intensified heads toward the second inclined portion 21*b* of the light extraction structure 10. The inclination angle of the first inclined portion 21*a* is an angle at which, when the light having travelled through the light emitting layer 31 in the first direction D1 enters, the light is refracted to the third direction D3 that is a direction substantially perpendicular to the principal surface S1. The inclination angle of the second inclined portion 21*b* is an angle at which, when the light having travelled through the light emitting layer 31 in the second direction D2 enters, the light is refracted to the fourth direction D4 that is a direction substantially perpendicular to the principal surface S1. In this way, since there is a plurality of the inclined portions that refract light to a direction substantially perpendicular to the principal surface S1, according to the present embodiment, it is possible to efficiently extract light with a wavelength included in the peak wavelength range of the PL spectrum of the first light emitting material in a direction substantially perpendicular to the principal surface S1 of the substrate 1. Since light with a wavelength included in the peak wavelength range of the PL spectrum of the first light emitting material is particularly high-intensity light in light emission of the first light emitting material, so it is possible to increase light emission intensity by efficiently extracting the light. As a result, it is possible to increase the intensity of light that is emitted in a front direction.

Other Features of Present Embodiment

In the expression (1), the value of m is not limited as long as the value is an integer greater than or equal to zero; however, from the viewpoint of a wavelength range to be intensified, the value of m is preferably greater than or equal to zero and less than or equal to two, more preferably zero or one, and particularly preferably one. When m=1, not only light emission intensity intensified on a wide angle side is high but also the angle dependence of emission wavelength is small, so it is favorable.

The angle $\theta_1$ formed between the normal direction of the principal surface S1 of the substrate 1 and the first direction D1 is greater than zero degrees and less than 90 degrees. $\theta_1$ is preferably greater than or equal to five degrees and less than or equal to 45 degrees, and more preferably greater than or equal to 10 degrees and less than or equal to 30 degrees. When $\theta_1$ is greater than or equal to five degrees, it is possible to increase the amount of light emitted to the light emission side. When $\theta_1$ is less than or equal to 45 degrees, light traveling in the first direction D1 from the light emitting layer 31 is more easily caused to reach the inclined portion 21 of the light extraction structure 10.

As long as light with the first wavelength $\lambda_1$, traveling through the light emitting layer 31 in the first direction D1 or the second direction D2, is emitted in a direction substantially perpendicular to the light emitting portion 50 at the time of entering, the inclination angle of the first inclined portion 21*a* and the inclination angle of the second inclined portion 21*b* may be the same or may be different. When the horizontal distance and the vertical distance between the first light emitting point 91*a* and the first inclined portion 21*a* are respectively the same as the horizontal distance and the vertical distance between the second light emitting point 91*b* and the second inclined portion 21*b*, the inclination angle of the first inclined portion 21*a* and the inclination angle of the second inclined portion 21*b* are preferably the same.

The shape of the light extraction structure 10 is not limited; however, the shape of the light extraction structure 10 preferably has a curved surface in at least a part including the first inclined portion 21*a* and at least a part including the second inclined portion 21*b*. When the light extraction structure 10 at least partially has a curved surface, the inclination angle of the inclined portion 21 of the light extraction structure 10 continuously changes. When the inclination angle of the inclined portion 21 continuously changes, it is possible to continuously change the wavelength of light extracted in a direction substantially perpendicular to the principal surface S1 of the substrate 1, so it is possible to further improve luminous efficiency. For example, a case where the wavelength of light that travels through the light emitting layer 31 in the first direction D1 or the second direction D2 to be intensified is 460 nm is considered. At this time, when the light extraction structure 10 has a curved surface at a part including the inclined portion 21, light with a wavelength of near 460 nm in around the first direction D1 or the second direction D2 can also be extracted in a substantially perpendicular direction. The shape of the curved surface is not limited and is a spherical surface, an aspherical surface, or the like. The spherical surface may be part of a sphere surface. Particularly, as in the case of a microlens, the entire light extraction structure preferably has a curved surface. The shape of a microlens may be any one of a spherical surface and an aspherical surface.

Figures 6A, 6B, 6C:
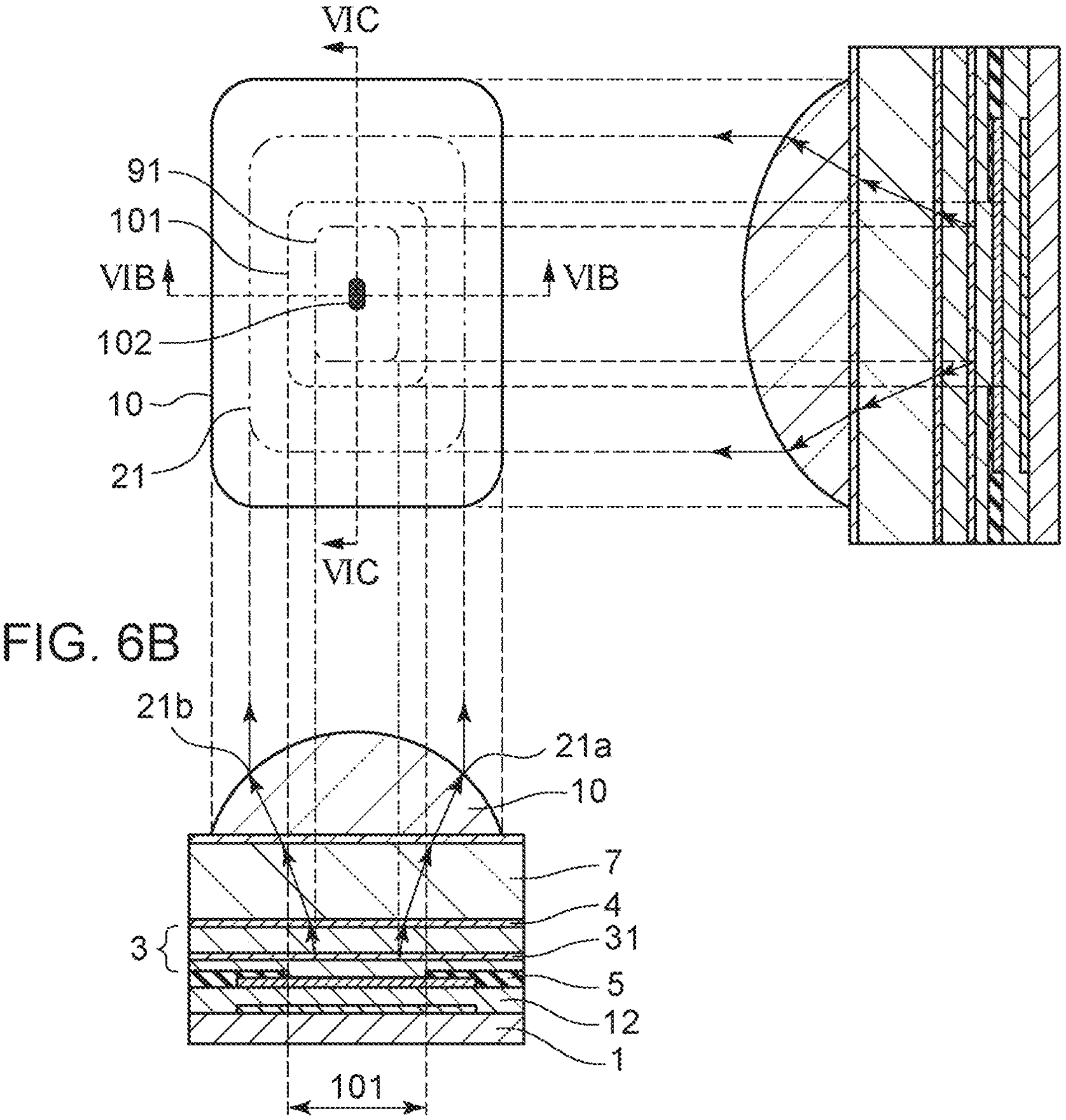
FIG. 6A is a plan view of an example of the first embodiment and FIGS. 6B and 6C are sectional views of the example.

In the above description, a certain cross section of the organic light emitting element has been described. The number of the inclined portions 21 may be three or more in a plan view of the substrate 1. The number of the light emitting points 91 including the first light emitting point 91*a* and the second light emitting point 91*b* may also be three or more in a plan view of the substrate 1. FIG. 6 shows a plan view and sectional views of an example of the present embodiment. FIG. 6A is a plan view of the present embodiment. FIG. 6B is a cross section taken along a line VIB of FIG. 6A. FIG. 6C is a cross section taken along a line VIC of FIG. 6A.

As shown in FIG. 6A, the light emitting point 91 is disposed so as to surround a center 102 of the light emission area 101 in a plan view perpendicular to the principal surface S1 of the substrate 1. The center 102 of the light emission area 101 may be a geometrical center of gravity of the light emission area 101. In this way, when the light emitting point 91 is disposed outside the center 102 of the light emission area 101 in a plan view and is disposed so as to surround the center 102, it is possible to expand the area in which the light emitting point 91 is present. Therefore, it is possible to increase the amount of light that travels through the light emitting layer 31 in the first direction D1 to constructively interfere and reaches the inclined portion 21. Furthermore, the inclined portion 21 is also disposed so as to surround the center 102 of the light emission area 101 in the plan view. The inclined portion 21 is preferably disposed so as to surround the light emitting point 91 in the plan view. With such a structure, a larger amount of light with the same solid angle can be extracted in the front direction, so it is possible to further improve light emission intensity in the front direction, that is, light emission intensity in a direction substantially perpendicular to the principal surface S1 of the substrate 1. The inclined portion 21 is preferably disposed so as to surround the outer edge of the light emission area 101 in the plan view. Furthermore, in the plan view, the outer edge of the light extraction structure 10 is preferably disposed so as to surround the inclined portion 21.

Figures 7A, 7B, 7C:
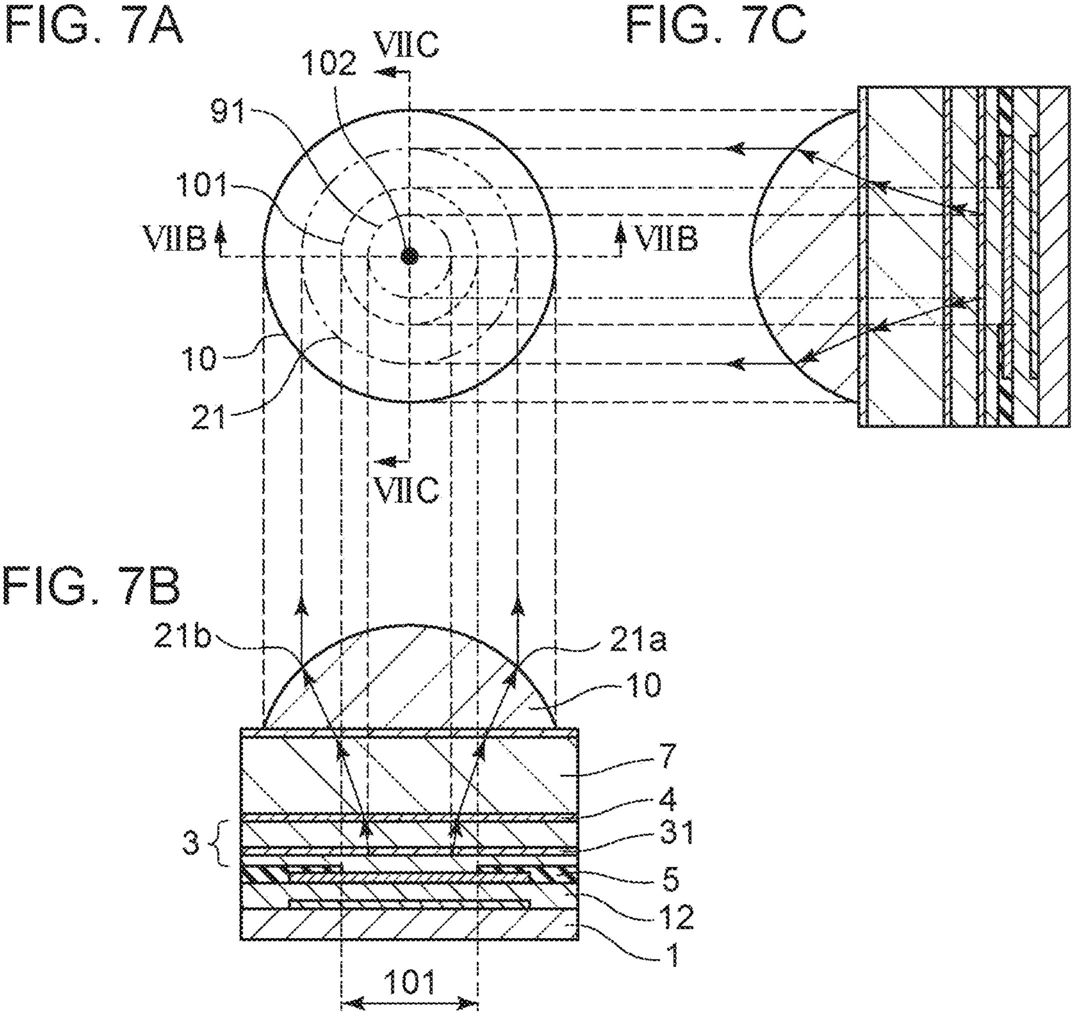
FIG. 7A is a plan view of an example of the first embodiment and FIGS. 7B and 7C are sectional views of the example.

Furthermore, the light emitting point 91 and the inclined portion 21 each are preferably rotation-symmetric with respect to a normal line passing through the center 102 of the light emission area 101. FIG. 7 shows a plan view and sectional views of an example of the present embodiment. FIG. 7A is a plan view of the present embodiment. FIG. 7B is a cross section taken along a line VIIB of FIG. 7A. FIG. 7C is a cross section taken along a line VIIC of FIG. 7A.

As shown in FIG. 7(*a*), in this example, in a plan view, the light emitting point 91 is disposed in a form having a shape rotation-symmetric with respect to the normal line passing through the center 102 of the light emission area 101. In a plan view, the inclined portion 21 is also disposed in a form having a shape rotation-symmetric with respect to the normal line passing through the center 102 of the light emission area 101. In other words, the light emitting point 91 is disposed in a circular shape about the center 102 of the light emission area 101 in a plan view, and the inclined portion 21 is disposed in a circular shape about the center 102 of the light emission area 101 in a plan view. The light emitting point 91 and the inclined portion 21 are disposed concentrically about the center 102 of the light emission area 101 in a plan view. Thus, light emission characteristics for each azimuth angle are uniform and favorable. In the case of FIG. 7, the light extraction structure 10 preferably has a rotation-symmetric shape in a plan view and is particularly preferably a microlens having a curved surface. A portion where the light extraction structure 10 is rotation-symmetric may be the entire light extraction structure 10 or may be part of the light extraction structure 10.

Other Configuration Examples of Present Embodiment

Other configuration examples of the present embodiment will be described below.

The organic light emitting element 100 according to the present embodiment may include an insulating layer 5 provided on an outer peripheral part of the lower electrode 2 so as to cover an end of the lower electrode 2. In other words, the insulating layer 5 may be disposed on the lower electrode 2, and the insulating layer 5 may have an opening such that part of the lower electrode 2 is exposed. The lower electrode 2 and the organic compound layer 3 contact with each other at the opening of the insulating layer 5. In this way, the insulating layer 5 may have a function to define the light emission area 101 of the organic light emitting element 100 and may be formed to form the light emission area 101 accurately into a desired shape. The insulating layer 5 may have a function to electrically insulate the lower electrodes 2 of adjacent two of the organic light emitting elements 100. The insulating layer 5 is also called a pixel division layer (PDL), a partition wall, a bank, or the like. When the insulating layer 5 is not provided, the light emission area 101 is defined by the shape of the lower electrode 2. The insulating layer 5 is made of an inorganic material, such as silicon nitride (SiN), silicon oxynitride (SiON), and silicon oxide (SiO). The insulating layer 5 may be formed by using a known method, such as a sputtering method and a chemical vapor deposition method (CVD method). Alternatively, the insulating layer 5 may be made of an organic material, such as acrylic resin and polyimide resin.

A plane shape of the opening of the insulating layer 5 is not limited and is preferably substantially a similar figure of the plane shape of the light extraction structure 10. When, for example, the plane shape of the light extraction structure 10 is a circular shape, the plane shape of the opening of the insulating layer 5 is also preferably a circular shape. When the plane shape of the opening of the insulating layer 5 is substantially a similar figure of the plane shape of the light extraction structure 10, the light emission characteristics of the organic light emitting element can be formed symmetrically with respect to the azimuth angle of the organic light emitting element. Since the plane shape of the light extraction structure 10 is preferably rotation-symmetric, the plane shape of the opening of the insulating layer 5 is particularly preferably substantially a circular shape.

The organic light emitting element 100 according to the present embodiment may include a sealing layer 6 formed so as to cover the organic compound layer 3 and the upper electrode 4. The sealing layer 6 preferably contains an inorganic material having a translucency and a significantly low permeability of oxygen and moisture from the outside. The inorganic material contained in the sealing layer 6 is preferably silicon nitride (SiN), silicon oxynitride (SiON), silicon oxide ($SiO_x$), aluminum oxide ($Al_2O_3$), or titanium oxide ($TiO_2$). Of these, the sealing layer 6 preferably contains SiN, SiON, and $Al_2O_3$ from the viewpoint of enhancing sealing performance. A chemical vapor deposition method (CVD method), an atomic layer deposition method (ALD method), a sputtering method, or an ion plating method is preferably used to form the sealing layer 6. When the sealing layer 6 has sufficient moisture barrier performance, the sealing layer 6 may have a single-layer structure or may have a lamination structure obtained by a combination of the above-described materials and formation methods. The sealing layer 6 may have a lamination structure of an inorganic material and an organic material, such as a resin. When a plurality of organic light emitting elements is formed on the substrate 1, the sealing layer 6 may be disposed continuously between any adjacent two of the organic light emitting elements astride the upper electrodes 4 of the organic light emitting elements. At this time, the upper electrode 4 may also be disposed continuously between any adjacent two of the organic light emitting elements.

A planarization layer 7 may be formed on the sealing layer 6 of the organic light emitting element 100. The planarization layer 7 is preferably formed by a wet process, such as a spin coating method, a dip coating method, a slit coating method, and a blade coating method. With the wet process, it is easy to planarize the light emission-side surface of the planarization layer 7. The planarization layer 7 formed by a wet process is preferably cured by heating, UV irradiation, or the like after formation. When a plurality of organic light emitting elements is formed on the substrate 1, the planarization layer 7 may be disposed continuously between any adjacent two of the organic light emitting elements astride the sealing layers 6 of the organic light emitting elements.

Second Embodiment

Figure 8:
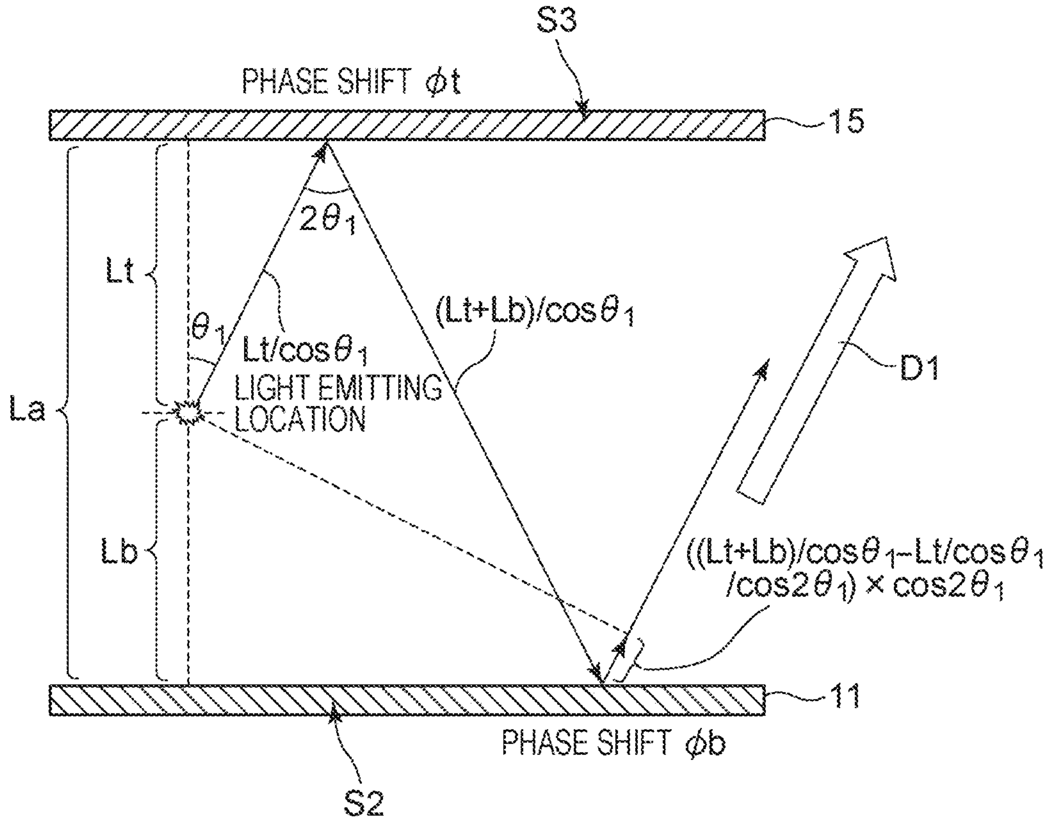
FIG. 8 is a schematic sectional view for illustrating optical interference in an organic light emitting element of a light emitting apparatus according to a second embodiment.

A light emitting apparatus according to a second embodiment of the present invention will be described. The description of portions common to those of the first embodiment is omitted as needed. FIG. 8 is a schematic sectional view for illustrating optical interference in an organic light emitting element of the light emitting apparatus according to the second embodiment.

A light emitting element of the light emitting apparatus according to the present embodiment differs from that of the first embodiment in that a half-reflection surface is provided between the light emitting layer 31 and the light extraction structure 10. More specifically, the light emitting element of the light emitting apparatus according to the present embodiment has a half-reflection surface S3 on the organic compound layer 3. In the light emitting element of the light emitting apparatus according to the present embodiment, the upper electrode 4 may have the half-reflection surface S3. More specifically, the lower surface of the upper electrode 4 may be the half-reflection surface S3. Alternatively, a half-reflective layer 15 may be provided separately from the upper electrode 4, and the half-reflective layer 15 may have the half-reflection surface S3.

In the present embodiment, third light L3 and second light L2 constructively interfere with each other. The third light L3 is light that is emitted from the light emitting layer 31 toward the light emission side, reflected on the half-reflection surface S3, travels to the light reflection side, reflected on the reflection surface S2, and travels in the first direction D1. The second light L2 is light that is emitted from the light emitting layer 31 toward the light emission side and travels in the first direction D1. To satisfy such optical interference conditions, the optical distance Lb between the light emitting layer 31 and the reflection surface S2 and an optical distance Lt between the light emitting layer 31 and the half-reflection surface S3 are adjusted.

More specifically, an optical distance La between the reflection surface S2 and the half-reflection surface S3 is adjusted so as to satisfy the following expression (6). When the following expression (6) is satisfied, the second light L2 and the third light L3 constructively interfere with each other, and light traveling through the light emitting layer 31 in the first direction D1 is intensified. Not only the optical distance La is adjusted but also a phase shift φb at the reflection surface S2 and a phase shift φt at the half-reflection surface S3 may be adjusted.

$$La/\cos\theta_1\times(1+\cos(2\theta_1))=\lambda_1\times(l-\varphi b/360-\varphi t/360) \quad (6)$$

In the expression (6), La denotes an optical distance (in nm) between the reflection surface S2 and the half-reflection surface S3, and $\theta_1$ denotes the angle (in degree) formed between the normal direction of the principal surface S1 of the substrate 1 and the first direction D1. $\lambda_1$ denotes a wavelength (in nm) included in the peak wavelength range of the PL spectrum of the first light emitting material contained in the light emitting layer 31, φb denotes a phase shift (in degree) at the time of reflecting on the reflection surface S2, and φt denotes a phase shift (in degree) at the time of reflecting on the half-reflection surface S3. l is an integer greater than or equal to zero.

With such a configuration as well, light with a wavelength included in the peak wavelength range of the PL spectrum of the first light emitting material can be intensified at the time of traveling in a direction inclined with respect to the normal direction (the first direction D1 or the second direction D2 in the light emitting layer 31). Thus, it is possible to further intensify light that is emitted from the light emitting layer 31. The intensified light, as in the case of the first embodiment, reaches the inclined portion 21 of the light extraction structure 10 to be refracted and emitted in a direction substantially perpendicular to the principal surface S1 of the substrate 1. As a result, it is possible to increase the intensity of light that is emitted in the front direction.

In the expression (6), the value of l is not limited as long as the value is an integer greater than or equal to zero; however, from the viewpoint of a wavelength range to be intensified, the value of l is preferably greater than or equal to zero and less than or equal to two, more preferably zero or one, and particularly preferably one. When l=1, not only light emission intensity intensified on a wide angle side is high but also the angle dependence of emission wavelength is small, so it is favorable.

Furthermore, as in the case of the first embodiment, the second light L2 and the first light L1 that is emitted from the light emitting layer 31 toward the light reflection side, reflected on the reflection surface S2, and travels in the first direction D1 may constructively interfere with each other. In other words, in addition to the above expression (6), the above expression (1) may also be satisfied. Thus, light with a wavelength included in the peak wavelength range of the PL spectrum of the first light emitting material, traveling in a direction inclined with respect to the normal direction (the first direction D1 or the second direction D2 in the light emitting layer 31), can be further intensified. Thus, it is possible to further increase the intensity of light that is emitted in the front direction.

Third Embodiment

Figure 9:
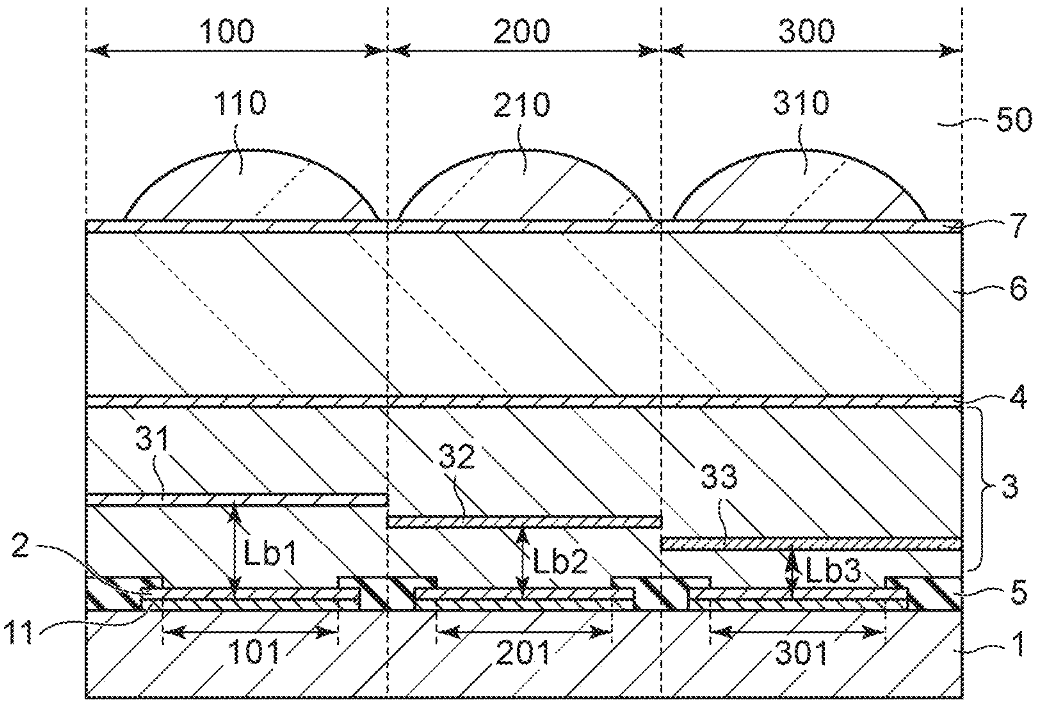
FIG. 9 is a schematic sectional view of a light emitting apparatus according to a third embodiment.

A third embodiment of the present invention will be described. The description of portions common to those of the first embodiment is omitted as needed. FIG. 9 is a schematic sectional view of a light emitting apparatus according to the third embodiment.

The light emitting apparatus according to the present embodiment includes a plurality of organic light emitting elements disposed on the substrate 1 (on the substrate) and includes a second organic light emitting element 200 and a third organic light emitting element 300 in addition to the first organic light emitting element 100. The configuration of the first organic light emitting element 100 is similar to the organic light emitting element 100 described in the first embodiment.

The second organic light emitting element 200 and the third organic light emitting element 300 each also have a similar basic configuration to the first organic light emitting element 100. In other words, each of the second organic light emitting element 200 and the third organic light emitting element 300, as in the case of the first organic light emitting element 100, includes the reflective layer 11, the lower electrode 2, the organic compound layer 3, the upper electrode 4, and the light extraction structure 10 on the substrate 1 from the principal surface S1 side (principal surface side) of the substrate 1. Each of the second organic light emitting element 200 and the third organic light emitting element 300, as in the case of the first organic light emitting element 100, includes the insulating layer 5 that covers the end of the lower electrode 2, the sealing layer 6 disposed on the upper electrode 4, and the planarization layer 7. Here, the light extraction structures of the first organic light emitting element 100, second organic light emitting element 200, and third organic light emitting element 300 are respectively referred to as light extraction structures 110, 210, 310.

Next, a difference of each of the second organic light emitting element 200 and the third organic light emitting element 300 from the first organic light emitting element 100 will be described. Each of the second organic light emitting element 200 and the third organic light emitting element 300 has a light emitting layer that emits light with a wavelength different from that of the first organic light emitting element 100. Each of the second organic light emitting element 200 and the third organic light emitting element 300 has a configuration such that rays of light traveling in a direction inclined with respect to the normal direction of the principal surface S1 of the substrate 1 with a wavelength different from that of the first organic light emitting element 100 constructively interfere with each other.

The organic compound layer 3 of the second organic light emitting element 200 has a light emitting layer 32. The light emitting layer 32 contains a second light emitting material different from the first light emitting material. The second light emitting material exhibits a PL spectrum different from that of the first light emitting material. A peak wavelength $\lambda_{p2}$ (nm) of the PL spectrum of the second light emitting material is different from the peak wavelength $\lambda_{p1}$ (nm) of the PL spectrum of the first light emitting material. The first organic light emitting element 100 emits light produced from the first light emitting material; whereas the second organic light emitting element 200 emits light produced from the second light emitting material. In other words, the first organic light emitting element 100 and the second organic light emitting element 200 respectively emit rays of light in different colors.

The second organic light emitting element 200 also has a resonator structure with which rays of emission light constructively interfere with each other as in the case of the first organic light emitting element 100, but has a different wavelength of light intensified from the first organic light emitting element 100. A wavelength included in a peak wavelength range of the PL spectrum of the second light emitting material is assumed as a second wavelength $\lambda_2$. At this time, in the second organic light emitting element 200, an optical distance Lb2 between the light emitting layer 32 and the reflection surface S2 is adjusted such that rays of light with the second wavelength $\lambda_2$, traveling through the light emitting layer 32 in the first direction D1 and the second direction D2, are intensified. Here, the first direction D1 and the second direction D2 are directions that intersect with the normal direction of the principal surface S1 of the substrate 1 and are also regarded as directions inclined with respect to the normal direction. The first direction D1 and the second direction D2 may be the same or may be different from the first direction D1 and the second direction D2 in the first organic light emitting element 100. In other words, the first direction D1 and the second direction D2 in the second organic light emitting element 200 may be referred to as a fifth direction and a sixth direction as distinguished from the first direction D1 and the second direction D2 in the first organic light emitting element.

In the second organic light emitting element 200 as well, as in the case of the first organic light emitting element 100, when light traveling through the light emitting layer 32 in the first direction D1 reaches the inclined portion 21 of the light extraction structure 210, the light is refracted and emitted in the third direction D3. When light traveling through the light emitting layer 32 in the second direction D2 reaches the inclined portion 21 of the light extraction structure 210, the light is refracted and emitted in the fourth direction D4. Here, the third direction D3 and the fourth direction D4 each are a direction substantially perpendicular to the principal surface S1 of the substrate 1. The third direction D3 and the fourth direction D4 may be the same or may be different from the third direction D3 and the fourth direction D4 in the first organic light emitting element 100. In other words, the third direction D3 and the fourth direction D4 in the second organic light emitting element 200 may be referred to as a seventh direction and an eighth direction as distinguished from the third direction D3 and the fourth direction D4 in the first organic light emitting element. Thus, light with a wavelength included in the peak wavelength range of the PL spectrum of the second light emitting material is intensified and emitted in the front direction of the light emitting apparatus. The second organic light emitting element 200 also has a plurality of inclined portions including the first inclined portion 21*a* and the second inclined portion 21*b* as the inclined portion 21. With the above configuration, as in the case of the mechanism in the first organic light emitting element 100, light emission intensity in the front direction is increased.

The third organic light emitting element 300 also has a resonator structure with which rays of emission light constructively interfere with each other as in the case of the first organic light emitting element 100, but has a different wavelength of light intensified from the first organic light emitting element 100. In the third organic light emitting element 300, an optical distance Lb3 between a light emitting layer 33 and the reflection surface S2 is adjusted such that, where a wavelength included in the peak wavelength range of the PL spectrum of the third light emitting material is a third wavelength λ3, rays of light with the third wavelength $\lambda_3$, traveling through the light emitting layer 33 in the first direction D1 and the second direction D2, are intensified. Here, the first direction D1 and the second direction D2 are directions that make an angle of greater than or equal to zero degrees with the normal direction of the principal surface S1 of the substrate 1 and are directions inclined with respect to the normal direction. The first direction D1 and the second direction D2 may be the same or may be different from the first direction D1 and the second direction D2 in the first organic light emitting element 100. The first direction D1 and the second direction D2 in the third organic light emitting element 300 may be referred to as a ninth direction and a tenth direction as distinguished from the first direction D1 and the second direction D2 in the first organic light emitting element.

In the third organic light emitting element 300 as well, as in the case of the first organic light emitting element 100, when light traveling through the light emitting layer 33 in the first direction D1 reaches the inclined portion 21 of the light extraction structure 310, the light is refracted and emitted in the third direction D3. When light traveling through the light emitting layer 33 in the second direction D2 reaches the inclined portion 21 of the light extraction structure 310, the light is refracted and emitted in the fourth direction D4. Here, the third direction D3 is a direction substantially perpendicular to the principal surface S1 of the substrate 1. The third direction D3 and the fourth direction D4 may be the same or may be different from the third direction D3 and the fourth direction D4 in the first organic light emitting element 100. In other words, the third direction D3 and the fourth direction D4 in the third organic light emitting element 300 may be referred to as an eleventh direction and a twelfth direction as distinguished from the third direction D3 and the fourth direction D4 in the first organic light emitting element. Thus, light with a wavelength included in the peak wavelength range of the PL spectrum of the third light emitting material is intensified and emitted in the front direction of the light emitting apparatus. The third organic light emitting element 300 also has a plurality of inclined portions including the first inclined portion 21*a* and the second inclined portion 21*b* as the inclined portion 21. With the above configuration, as in the case of the mechanism in the first organic light emitting element 100, light emission intensity in the front direction is increased with this configuration.

Here, an angle formed between the first direction D1 in which light with the first wavelength $\lambda_1$ (in nm) is intensified in the first organic light emitting element 100 and the normal direction of the principal surface S1 of the substrate 1 is denoted by $\theta_{11}$ (in degree), and an optical distance between the reflection surface S2 and the light emitting layer 31 is denoted by Lb1 (in nm). An angle formed between the first direction D1 in which light with the second wavelength $\lambda_2$ (in nm) is intensified in the second organic light emitting element 200 and the normal direction of the principal surface S1 of the substrate 1 is denoted by $\theta_{12}$ (in degree), and an optical distance between the reflection surface S2 and the light emitting layer 32 is denoted by Lb2 (in nm). An angle formed between the first direction D1 in which light with the third wavelength λ3 (in nm) is intensified in the third organic light emitting element 300 and the normal direction of the principal surface S1 of the substrate 1 is denoted by $\theta_{13}$ (in degree), and an optical distance between the reflection surface S2 and the light emitting layer 33 is denoted by Lb3 (in nm). At this time, as in the case of the above-described expression (1), the following expressions (7) to (9) hold.

$$Lb1/\cos\theta_{11}\times(1+\sin(90-2\theta_{11}))=\lambda_1\times(m1-\varphi b/360) \quad (7)$$

$$Lb2/\cos\theta_{12}\times(1+\sin(90-2\theta_{12}))=\lambda_2\times(m2-\varphi b/360) \quad (8)$$

$$Lb3/\cos\theta_{13}\times(1+\sin(90-2\theta_{13}))=\lambda_3\times(m3-\varphi b/360) \quad (9)$$

Here, in the expressions (7) to (9), m1 to m3 are integers greater than or equal to zero. Furthermore, when 011=012=013=$\theta_1$, the above expressions (7) to (9) can be converted to the following expressions (7)' to (9)'. Where m is an integer greater than or equal to zero, $$Lb1/\cos\theta_1\times(1+\sin(90-2\theta_1))=\lambda_1\times(m1-\varphi b/360) \quad (7)'$$

$$Lb2/\cos\theta_1\times(1+\sin(90-2\theta_1)=\lambda_2\times(m2-\varphi b/360) \quad (8)'$$

$$Lb3/\cos\theta_1\times(1+\sin(90-2\theta_1)=\lambda_3\times(m3-\varphi b/360) \quad (9)'$$

As described above, the first wavelength $\lambda_1$, the second wavelength $\lambda_2$, and the third wavelength $\lambda_3$ may be different from one another. When, for example, the first wavelength $\lambda_1$ is set to a wavelength in a red wavelength range, the second wavelength $\lambda_2$ is set to a wavelength in a green wavelength range, and the third wavelength $\lambda_3$ is set to a wavelength in a blue wavelength range, the light emitting apparatus can be a display apparatus capable of full-color display.

The optical distance Lb1, the optical distance Lb2, and the optical distance Lb3 may be different from one another. It is possible to vary the optical distances Lb1 to Lb3 by varying at least one of the film thickness and refractive index of each of the organic compound layer 3, lower electrode 2, and optical interference layer 12 provided between the reflection surface S2 and a corresponding one of the light emitting layers 31 to 33 of the corresponding organic light emitting element.

The inclination angle of the inclined portion 21 of the light extraction structure 10 of each of the first organic light emitting element 100, the second organic light emitting element 200, and the third organic light emitting element 300 may be the same or may be different. From the viewpoint of simplification of a manufacturing method, the inclination angle of the inclined portion 21 of the light extraction structure 10 of each of the first organic light emitting element 100, the second organic light emitting element 200, and the third organic light emitting element 300 is preferably the same. Furthermore, the light extraction structure 10 of each of the first organic light emitting element 100, the second organic light emitting element 200, and the third organic light emitting element 300 more preferably has the same shape.

Each of the plurality of organic light emitting elements, that is, the first organic light emitting element 100, the second organic light emitting element 200, and the third organic light emitting element 300, disposed on the substrate 1, may be regarded as a sub-pixel. A main pixel may be made up of a plurality of sub-pixels, and a light emitting apparatus may be configured such that a plurality of the main pixels is disposed on the substrate 1. Thus, the light emitting apparatus may be configured as a display apparatus capable of high-definition display. For example, each of the plurality of main pixels may include a first sub-pixel having the first organic light emitting element 100, a second sub-pixel having the second organic light emitting element 200, and a third sub-pixel having the third organic light emitting element 300. A pixel array of sub-pixels and main pixels may be any pixel array, such as a stripe array, a delta array, a Bayer array, and a pentile array. Of these, a delta array is preferable because a circular lens can be easily arranged in a display plane.

Fourth Embodiment

Figure 10:
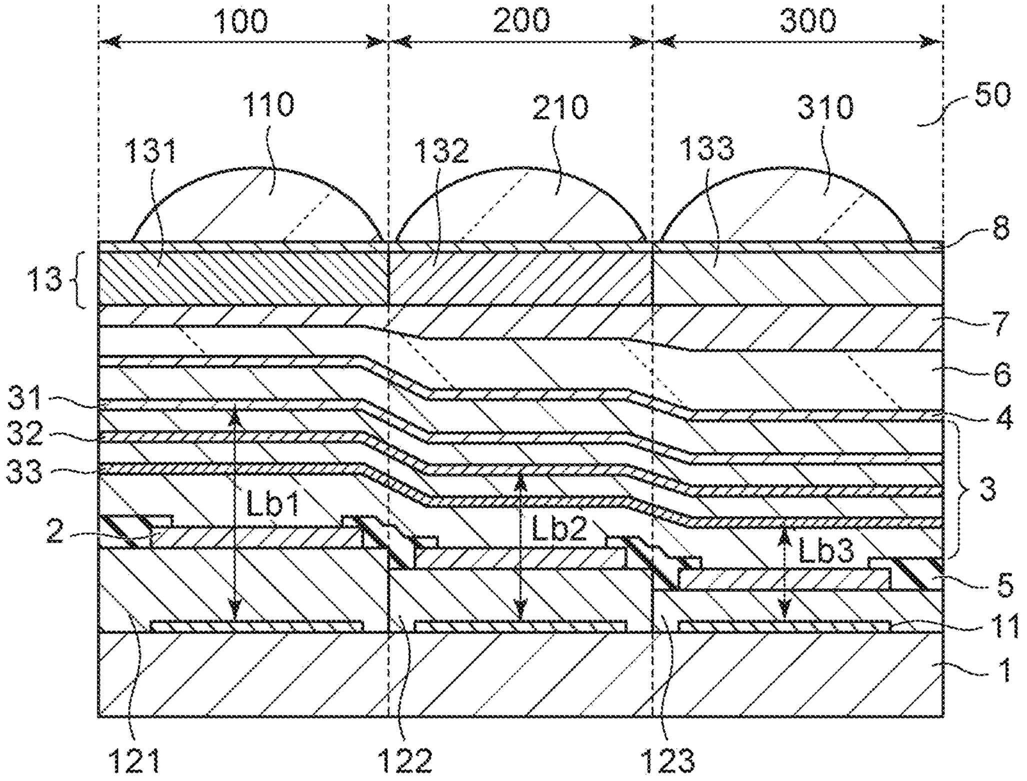
FIG. 10 is a schematic sectional view of a light emitting apparatus according to a fourth embodiment.

A fourth embodiment of the present invention will be described. The description of portions common to those of the third embodiment is omitted as needed. FIG. 10 is a schematic sectional view of a light emitting apparatus according to the fourth embodiment.

The light emitting apparatus according to the present embodiment includes a plurality of organic light emitting elements and includes the first organic light emitting element 100, the second organic light emitting element 200, and the third organic light emitting element 300, as in the case of the third embodiment.

The light emitting apparatus according to the third embodiment is configured such that the light emitting layers respectively containing different light emitting materials are provided in correspondence with the organic light emitting elements. In other words, the first organic light emitting element 100 includes the light emitting layer 31, the second organic light emitting element 200 includes the light emitting layer 32, and the third organic light emitting element 300 includes the light emitting layer 33. In contrast, in the light emitting apparatus according to the present embodiment, each of the organic light emitting elements includes all the light emitting layers 31 to 33. In other words, each of the first organic light emitting element 100, the second organic light emitting element 200, and the third organic light emitting element 300 includes the light emitting layers 31 to 33. The light emitting layer 31 contains a first light emitting material, the light emitting layer 32 contains a second light emitting material, and the light emitting layer 33 contains a third light emitting material.

Therefore, in the light emitting apparatus according to the present embodiment, light obtained by mixing light emitted from the first light emitting material, light emitted from the second light emitting material, and light emitted from the third light emitting material is emitted from the organic compound layer 3 of each organic light emitting element. When, for example, the first light emitting material is a red light emitting material, the second light emitting material is a green light emitting material, and the third light emitting material is a blue light emitting material, white light is emitted from the organic compound layer 3 of each organic light emitting element.

The light emitting layers 31 to 33 may be independently formed in each of the first organic light emitting element 100, the second organic light emitting element 200, and the third organic light emitting element 300 or may be formed commonly over the plurality of organic light emitting elements. FIG. 10 shows an example in which the light emitting layers 31 to 33 are formed commonly over the first organic light emitting element 100, the second organic light emitting element 200, and the third organic light emitting element 300. When the size of each organic light emitting element in a plan view is small with respect to the substrate 1 as in the case of an ultra high-definition display, it may be difficult to form the light emitting layers 31 to 33 independently for each of the organic light emitting elements. In such a case, it is possible to make it easy to perform manufacturing by forming the light emitting layers 31 to 33 commonly over a plurality of organic light emitting elements.

In the present embodiment, three types of light emitting layers, that is, the light emitting layers 31 to 33, are formed;

however, the present invention is not limited thereto. Not the three types of light emitting layers are respectively formed but one light emitting layer may contain a first light emitting material, a second light emitting material, and a third light emitting material. Alternatively, two types of light emitting layers may be formed. In this case, a light emitting layer containing one type of light emitting material and a light emitting layer containing two types of light emitting materials may be combined, like one light emitting layer contains a first light emitting material and the other light emitting layer contains a second light emitting material and a thrid light emitting material. A combination is selectable according to the types of light emitting materials.

The light emitting apparatus according to the present embodiment includes a color filter layer 13 above the upper electrode 4. The color filter layer 13 includes a first color filter 131, a second color filter 132, and a third color filter 133. The first color filter 131, the second color filter 132, and the third color filter 133 may be different in the wavelength range of light transmitted from one another. In the present embodiment, the color filter layer 13 is disposed between the upper electrode 4 and the light extraction structure 10. The color filter layer 13 may be disposed on or above the light extraction structure 10. The first color filter 131 is disposed between the upper electrode 4 of the first organic light emitting element 100 and the light extraction structure 10. The second color filter 132 is disposed between the upper electrode 4 of the second organic light emitting element 200 and the light extraction structure 10. The third color filter 133 is disposed between the upper electrode 4 of the third organic light emitting element 300 and the light extraction structure 10. In the present embodiment, the color filter layer 13 is disposed on the planarization layer 7, and a planarization layer 8 is further disposed on the color filter layer 13. Thus, the color filter layer 13 and the light extraction structure 10 can be formed on a flat surface, so it is preferable.

The first color filter 131, the second color filter 132, and the third color filter 133 can be formed by applying color resist on a base such as the planarization layer 7 and then patterning the color resist by lithography. The color resist is made of, for example, a photocurable resin, and a pattern is formed by curing an area to which ultraviolet rays or the like are applied.

Here, the first color filter 131 transmits light in a wavelength range including the first wavelength $\lambda_1$, the second color filter 132 transmits light in a wavelength range including the second wavelength $\lambda_2$, and the third color filter 133 transmits light in a wavelength range including the third wavelength $\lambda_3$. The first wavelength $\lambda_1$ is a wavelength included in the peak wavelength range of the PL spectrum of the first light emitting material contained in the light emitting layer 31. The second wavelength $\lambda_2$ is a wavelength included in the peak wavelength range of the PL spectrum of the second light emitting material contained in the light emitting layer 32. The third wavelength $\lambda_3$ is a wavelength included in the peak wavelength range of the PL spectrum of the third light emitting material contained in the light emitting layer 33. In other words, by the color filter layer 13, light with the first wavelength $\lambda_1$ is extracted from the first organic light emitting element 100, light with the second wavelength $\lambda_2$ is extracted from the second organic light emitting element 200, and light with the third wavelength $\lambda_3$ is extracted from the third organic light emitting element 300. The first color filter 131 does not need to transmit light with the second wavelength $\lambda_2$ or light with the third wavelength $\lambda_3$. The second color filter 132 does not need to transmit light with the third wavelength $\lambda_3$ or light with the first wavelength $\lambda_1$. The third color filter 133 does not need to transmit light with the first wavelength $\lambda_1$ or light with the second wavelength $\lambda_2$.

In the present embodiment, rays of light with a wavelength included in the wavelength range of light extracted from each organic light emitting element via the color filter layer 13 are configured to constructively interfere with each other at the time of traveling in a direction inclined with respect to the normal direction of the principal surface S1 of the substrate 1 in the light emitting layer. In other words, in the first organic light emitting element 100, the optical distance Lb1 between the light emitting layer 31 and the reflection surface S2 is adjusted such that light with the first wavelength $\lambda_1$, traveling through the light emitting layer 31 in the first direction D1, is intensified. In the second organic light emitting element 200, the optical distance Lb2 between the light emitting layer 32 and the reflection surface S2 is adjusted such that light with the second wavelength $\lambda_2$, traveling through the light emitting layer 32 in the first direction D1, is intensified. In the third organic light emitting element 300, the optical distance Lb3 between the light emitting layer 33 and the reflection surface S2 is adjusted such that light with the third wavelength $\lambda_3$, traveling through the light emitting layer 33 in the first direction D1, is intensified. More specifically, the optical distances Lb1 to Lb3 are adjusted such that the above-described expressions (7) to (9) or the above-described expressions (7)' to (9)' hold. When the first wavelength $\lambda_1$, the second wavelength $\lambda_2$, and the third wavelength $\lambda_3$ are different from one another, the optical distances Lb1 to Lb3 may be different from one another.

It is possible to adjust the optical distances Lb1 to Lb3 by adjusting at least one of the film thickness and refractive index of each of the organic compound layer 3, lower electrode 2, and optical interference layer 12 provided between the reflection surface S2 and the light emitting layers 31 to 33 of a corresponding one of the organic light emitting elements. Of these, from the viewpoint of easiness of manufacturing, the optical distances Lb1 to Lb3 are preferably adjusted by adjusting the thickness of the optical interference layer 12. In the present embodiment, the first organic light emitting element 100 includes a first optical interference layer 121, the second organic light emitting element 200 includes a second optical interference layer 122, and the third organic light emitting element 300 has a third optical interference layer 123. The thickness of the first optical interference layer 121, the thickness of the second optical interference layer 122, and the thickness of the third optical interference layer 123 are different from one another, so the optical distances Lb1 to Lb3 are also different from one another. Therefore, the wavelength of light that is intensified when traveling in the first direction D1 varies among the organic light emitting elements as described above.

As in the case of the other embodiments, light intensified as a result of traveling in the first direction D1 in each organic light emitting element is emitted in a direction substantially perpendicular to the principal surface S1 of the substrate 1 at the inclined portion 21 of the light extraction structure 10.

The present embodiment is particularly useful when, as in the case of an ultra high-definition display, it is difficult to separately form organic compound layers in the first organic light emitting element 100, the second organic light emitting element 200, and the third organic light emitting element 300.

In the light emitting layer, when light traveling in a direction inclined with respect to the normal direction of the principal surface S1 of the substrate 1 is intensified, there is a possibility that light enters an adjacent one of the organic light emitting elements and, as a result, a color mixture occurs. However, in the present embodiment, since the color filter layer 13 is disposed, it is possible to absorb light having entered an adjacent one of the organic light emitting elements by the color filter layer 13 disposed at the upper side of the adjacent organic light emitting element and suppress emission to the outside. When, for example, light enters from the first organic light emitting element 100 to the second organic light emitting element 200, light with the first wavelength $\lambda_1$ is absorbed by the second color filter 132 disposed at the upper side of the second organic light emitting element 200 and not emitted to the outside. Thus, a color mixture is suppressed.

Fifth Embodiment

A fifth embodiment of the present invention will be described. The description of portions common to those of the third embodiment and the fourth embodiment is omitted as needed.

The light emitting apparatus according to the present embodiment includes a plurality of organic light emitting elements and includes the first organic light emitting element 100, the second organic light emitting element 200, and the third organic light emitting element 300, as in the case of the third embodiment and the fourth embodiment. In the present embodiment, as in the case of the third embodiment, the light emitting layers respectively containing different light emitting materials may be provided in correspondence with the organic light emitting elements. In other words, the first organic light emitting element 100 may include the light emitting layer 31, the second organic light emitting element 200 may include the light emitting layer 32, and the third organic light emitting element 300 may include the light emitting layer 33. In the light emitting apparatus according to the present embodiment, as in the case of the fourth embodiment, each of the organic light emitting elements may include all the light emitting layers 31 to 33.

In the present embodiment, the light emitting layer 31 contains a first light emitting material, the light emitting layer 32 contains a second light emitting material, and the light emitting layer 33 contains a third light emitting material. Of the peak wavelength of the PL spectrum of the first light emitting material, the peak wavelength of the PL spectrum of the second light emitting material, and the peak wavelength of the PL spectrum of the third light emitting material, at least the peak wavelength of the PL spectrum of the first light emitting material and the peak wavelength of the PL spectrum of the second light emitting material are different from each other.

In addition, of a full width at half maximum FWHM1 of the PL spectrum of the first light emitting material, a full width at half maximum FWHM2 of the PL spectrum of the second light emitting material, and a full width at half maximum FWHM3 of the PL spectrum of the third light emitting material, at least the full width at half maximum FWHM2 of the PL spectrum of the second light emitting material is greater than the full width at half maximum FWHM1 of the PL spectrum of the first light emitting material.

Each of the first organic light emitting element 100, the second organic light emitting element 200, and the third organic light emitting element 300 has a resonator structure with which rays of emission light constructively interfere with each other. Specifically, in the first organic light emitting element 100, the resonator structure is formed such that the peak wavelength range of the PL spectrum of the first light emitting material is intensified in the first direction and the second direction. In the second organic light emitting element 200, the resonator structure is formed such that the peak wavelength range of the PL spectrum of the second light emitting material is intensified in the fifth direction and the sixth direction. In the third organic light emitting element 300, the resonator structure is formed such that the peak wavelength range of the PL spectrum of the third light emitting material is intensified in the ninth direction and the tenth direction.

In the present embodiment, of the first organic light emitting element 100, the second organic light emitting element 200, and the third organic light emitting element 300, an absolute value of an angle formed between the normal direction of the principal surface S1 and the fifth direction and an absolute value of an angle formed between the normal direction of the principal surface S1 and the sixth direction in the second organic light emitting element 200 are smaller than an absolute value of an angle formed between the normal direction of the principal surface S1 and the first direction and an absolute value of an angle formed between the normal direction of the principal surface S1 and the second direction in the first organic light emitting element 100.

As the direction in which the peak wavelength range of the PL spectrum is intensified with the resonator structure approaches the normal direction of the principal surface S1, the full width at half maximum of the emission spectrum reduces. On the other hand, as the direction in which the peak wavelength range of the PL spectrum is intensified goes away from the normal direction of the principal surface S1, the full width at half maximum of the emission spectrum increases.

In the present embodiment, the second organic light emitting element 200 contains a second light emitting material of which the full width at half maximum of the PL spectrum is greater than that of the first light emitting material. On the other hand, in the second organic light emitting element 200, the direction in which the peak wavelength range of the PL spectrum is intensified with the resonator structure is nearer with respect to the normal direction of the principal surface S1 than that in the first organic light emitting element. Therefore, in the present embodiment, the full width at half maximum of the emission spectrum of the second organic light emitting element can be controlled so as not to excessively increase. Since the full width at half maximum of the emission spectrum of the second organic light emitting element can be controlled so as not to excessively increase, the structure according to the present embodiment has such a feature that it is easy to separate color between the emission spectrum of the first organic light emitting element and the emission spectrum of the second organic light emitting element. An advantage in a case where color is easily separated is that it is easy to correct lateral chromatic aberration. Correction of lateral chromatic aberration is a technology for correcting lateral chromatic aberration that occurs when passing light, produced by the light emitting apparatus, through an optical system, such as a lens, by adjusting the amount of light emission of a light emitting element in the light emitting apparatus.

Particularly, the second light emitting material of the second organic light emitting element 200 is preferably a phosphorescent material. This is because, when the PL spectrum shape of a phosphorescent material is compared with the PL spectrum shape of a fluorescent material, the full width at half maximum of the PL spectrum tends to be large. Furthermore, the first light emitting material of the first organic light emitting element 100 is preferably a fluorescent material.

The light extraction structure 110 of the first organic light emitting element and the light extraction structure 210 of the second organic light emitting element may have the same shape or may have different shapes as long as requirements described in the first embodiment are satisfied.

Sixth Embodiment

A sixth embodiment of the present invention will be described. The description of portions common to those of the third embodiment and the fourth embodiment is omitted as needed.

In the present embodiment, the first organic light emitting element 100, the second organic light emitting element 200, and the third organic light emitting element 300 are provided.

In the present embodiment, the light emitting layer 31 contains a first light emitting material, the light emitting layer 32 contains a second light emitting material, and the light emitting layer 33 contains a third light emitting material. Of the peak wavelength of the PL spectrum of the first light emitting material, the peak wavelength of the PL spectrum of the second light emitting material, and the peak wavelength of the PL spectrum of the third light emitting material, at least the peak wavelength of the PL spectrum of the first light emitting material and the peak wavelength of the PL spectrum of the second light emitting material are different from each other.

Each of the first organic light emitting element 100, the second organic light emitting element 200, and the third organic light emitting element 300 has a resonator structure with which rays of emission light constructively interfere with each other. Specifically, in the first organic light emitting element 100, the resonator structure is formed such that the first wavelength in the peak wavelength range of the PL spectrum of the first light emitting material is intensified in the first direction and the second direction. In the second organic light emitting element 200, the resonator structure is formed such that the second wavelength in the peak wavelength range of the PL spectrum of the second light emitting material is intensified in the fifth direction and the sixth direction. In the third organic light emitting element 300, the resonator structure is formed such that the third wavelength in the peak wavelength range of the PL spectrum of the third light emitting material is intensified in the ninth direction and the tenth direction.

In the present embodiment, the first organic light emitting element satisfies the following expression (10).

$$Lb1/\cos\theta_1\times(1+\sin(90-2\theta_1))=\lambda_1\times(m1-\varphi b1/360) \quad (10)$$

In the expression (10), Lb1 denotes the optical distance (in nm) between the light emitting layer 31 and the reflection surface S2, and $\theta_1$ denotes the angle (in degree) formed between the normal direction of the principal surface S1 of the substrate 1 and the first direction. $\lambda_1$ denotes a wavelength (in nm) included in the peak wavelength range of the PL spectrum of the first light emitting material contained in the light emitting layer 31, and φb1 denotes a phase shift (in degree) at the time of reflecting on the reflection surface S2. m1 is an integer greater than or equal to zero.

Furthermore, the second organic light emitting element satisfies the following expression (11).

$$Lb2/\cos\theta_2\times(1+\sin(90-2\theta_2))=\lambda_2\times(m2-\varphi b2/360) \quad (11)$$

In the expression (11), Lb2 denotes the optical distance (in nm) between the light emitting layer 32 and the reflection surface S2, and $\theta_2$ denotes an angle (in degree) formed between the normal direction of the principal surface S1 of the substrate 1 and the fifth direction. $\lambda_2$ denotes a wavelength (in nm) included in the peak wavelength range of the PL spectrum of the second light emitting material contained in the light emitting layer 32, and φb2 denotes a phase shift (in degree) at the time of reflecting on the reflection surface S2. m2 is an integer greater than or equal to zero.

In the present embodiment, m2 of the second organic light emitting element is less than m1 of the first organic light emitting element. On the other hand, an absolute value of an angle formed between the normal direction of the principal surface S1 and the fifth direction and an absolute value of an angle formed between the normal direction of the principal surface S1 and the sixth direction in the second organic light emitting element 200 are smaller than an absolute value of an angle formed between the normal direction of the principal surface S1 and the first direction and an absolute value of an angle formed between the normal direction of the principal surface S1 and the second direction in the first organic light emitting element 100.

Since the wavelength range that is intensified with the resonator structure increases as the values of m1 and m2 reduce, the full width at half maximum of the emission spectrum increases.

m2 of the second organic light emitting element in the present embodiment is less than m1 of the first organic light emitting element, and an absolute value of an angle formed between the normal direction of the principal surface S1 and the fifth direction and an absolute value of an angle formed between the normal direction of the principal surface S1 and the sixth direction in the second organic light emitting element 200 are smaller than an absolute value of an angle formed between the normal direction of the principal surface S1 and the first direction and an absolute value of an angle formed between the normal direction of the principal surface S1 and the second direction in the first organic light emitting element 100. Thus, in the present embodiment, the full width at half maximum of the emission spectrum of the second organic light emitting element can be controlled so as not to excessively increase. Therefore, the structure according to the present embodiment has such a feature that it is easy to separate color between the emission spectrum of the first organic light emitting element and the emission spectrum of the second organic light emitting element.

In the present embodiment, the value of m2 of the second organic light emitting element is zero, and the value of m1 of the first organic light emitting element is one, so it is particularly preferable.

Seventh Embodiment

A seventh embodiment of the present invention will be described. The description of portions common to those of the third embodiment and the fourth embodiment is omitted as needed.

In the present embodiment, the first organic light emitting element 100, the second organic light emitting element 200, and the third organic light emitting element 300 are provided.

In the present embodiment, the light emitting layer 31 contains a first light emitting material, the light emitting layer 32 contains a second light emitting material, and the light emitting layer 33 contains a third light emitting material. The peak wavelength of the PL spectrum of the first light emitting material, the peak wavelength of the PL spectrum of the second light emitting material, and the peak wavelength of the PL spectrum of the third light emitting material are different from one another.

Each of the first organic light emitting element 100, the second organic light emitting element 200, and the third organic light emitting element 300 has a resonator structure with which rays of emission light constructively interfere with each other. Specifically, in the first organic light emitting element 100, the resonator structure is formed such that the first wavelength in the peak wavelength range of the PL spectrum of the first light emitting material is intensified in the first direction and the second direction. In the second organic light emitting element 200, the resonator structure is formed such that the second wavelength in the peak wavelength range of the PL spectrum of the second light emitting material is intensified in the fifth direction and the sixth direction. In the third organic light emitting element 300, the resonator structure is formed such that the third wavelength in the peak wavelength range of the PL spectrum of the third light emitting material is intensified in the ninth direction and the tenth direction.

In the present embodiment, the peak wavelength of the PL spectrum of the second light emitting material is intermediate between the peak wavelength of the PL spectrum of the first light emitting material and the peak wavelength of the PL spectrum of the third light emitting material.

On the other hand, an absolute value of an angle formed between the normal direction of the principal surface S1 and the fifth direction and an absolute value of an angle formed between the normal direction of the principal surface S1 and the sixth direction in the second organic light emitting element 200 are smaller than an absolute value of an angle formed between the normal direction of the principal surface S1 and the first direction and an absolute value of an angle formed between the normal direction of the principal surface S1 and the second direction in the first organic light emitting element 100 or an absolute value of an angle formed between the normal direction of the principal surface S1 and the ninth direction and an absolute value of an angle formed between the normal direction of the principal surface S1 and the tenth direction in the third organic light emitting element 300.

With such a configuration, the full width at half maximum of the emission spectrum of the second organic light emitting element 200 does not excessively increase. Since the emission spectrum of the second organic light emitting element 200 is an intermediate color between the emission spectrum of the first organic light emitting element 100 and the emission spectrum of the third organic light emitting element 300, the emission spectrum of the second organic light emitting element 200 makes it easy to separate color between the emission spectrum of the first organic light emitting element 100 and the emission spectrum of the third organic light emitting element 300.

Particularly, the second organic light emitting element 200 preferably produces green light. Furthermore, preferably, the first organic light emitting element 100 produces blue or red light, and the third organic light emitting element 300 produces red or blue light. Green has an intermediate wavelength between red and blue, so color separation among red, green, and blue is easy.

OTHER EMBODIMENTS

Figure 11:
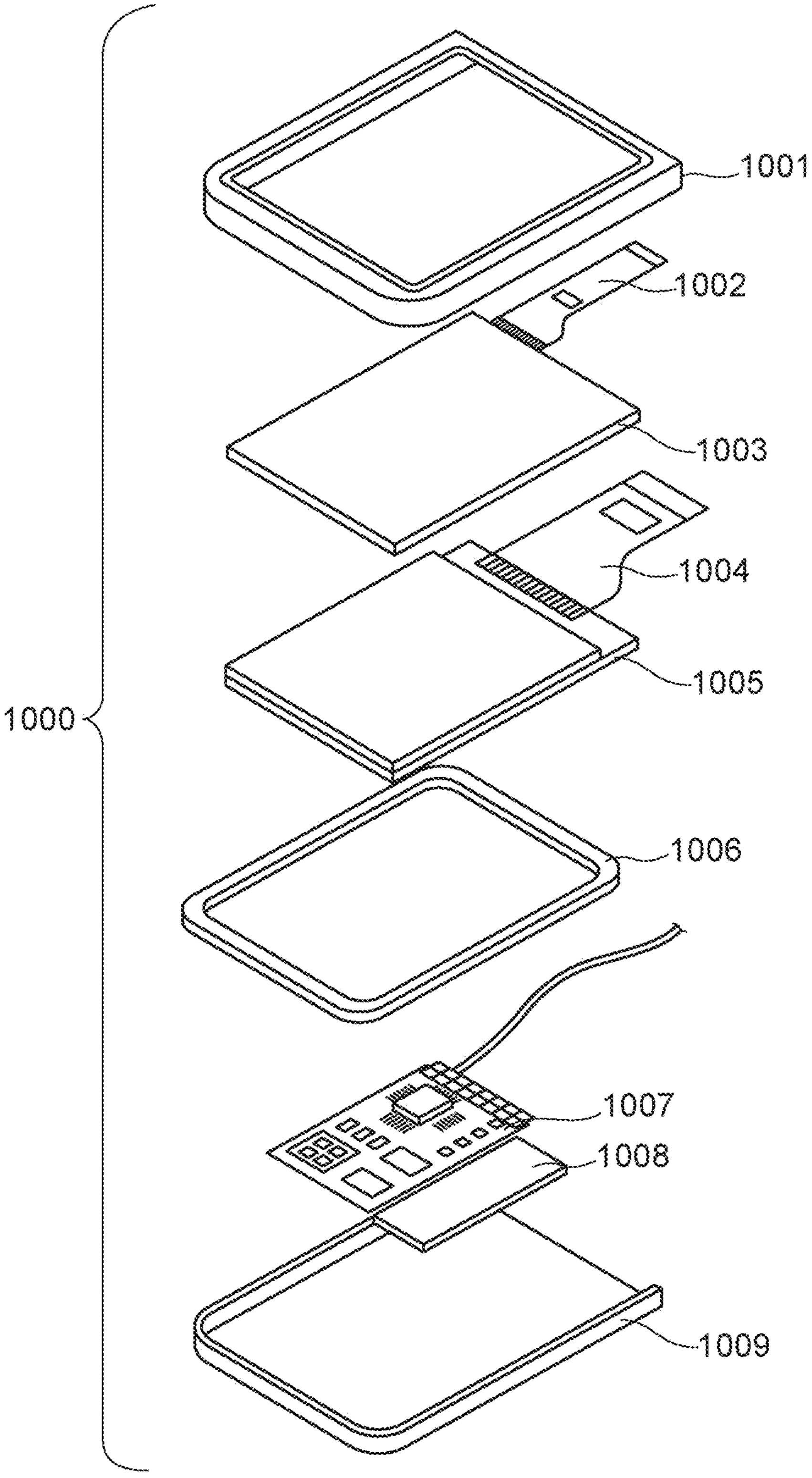
FIG. 11 is a schematic diagram that shows an example of a display apparatus.

FIG. 11 is a schematic view showing an example of a display apparatus 1000 according to the present embodiment. The display apparatus 1000 may include a touch panel 1003, a display panel 1005, a frame 1006, a circuit board 1007, and a battery 1008 between a top cover 1001 and a bottom cover 1009. For example, any one of the light emitting apparatuses according to the first to fourth embodiments may be used as the display panel 1005.

A flexible printed circuit (FPC) 1002 is connected to the touch panel 1003. A flexible printed circuit (FPC) 1004 is connected to the display panel 1005. Transistors are printed on the circuit board 1007. The battery 1008 does not need to be provided when the display apparatus is not a mobile device, or may be provided at another position even when the display apparatus is a mobile device.

The display apparatus 1000 according to the present embodiment may be used in a display unit of a photoelectric conversion apparatus including an optical unit having a plurality of lenses and an image pickup element that receives light having passed through the optical unit. The photoelectric conversion apparatus may include a display unit that displays information acquired by the image pickup element. The photoelectric conversion apparatus may acquire information using information acquired by the image pickup element, and the display unit may display information different from that information. The display unit may be a display unit exposed to the outside of the photoelectric conversion apparatus or may be a display unit disposed in a viewfinder. The photoelectric conversion apparatus may be a digital camera or a digital camcorder.

Figure 12A:
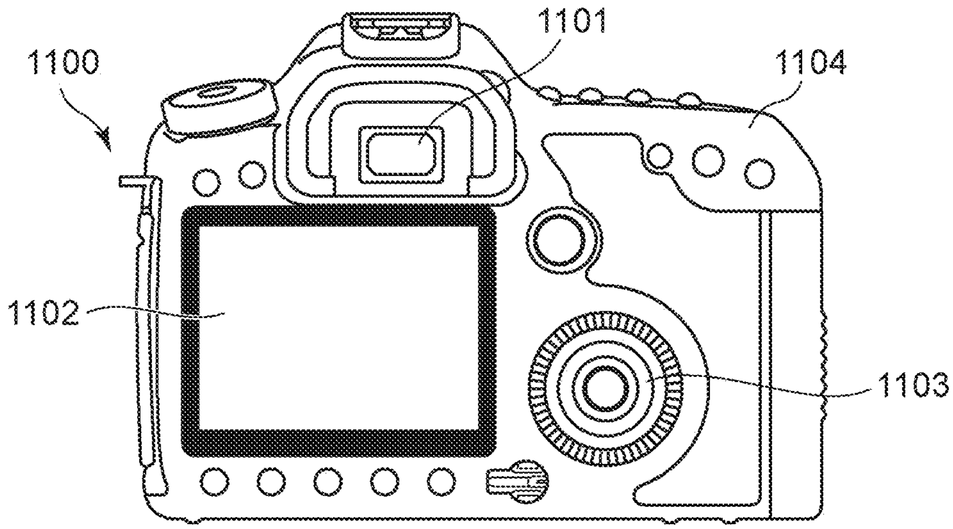
FIG. 12A is a schematic diagram that shows an example of a photoelectric conversion apparatus.

FIG. 12A is a schematic view showing an example of the photoelectric conversion apparatus according to the present embodiment. The photoelectric conversion apparatus 1100 may include a viewfinder 1101, a back display 1102, an operating portion 1103, and a housing 1104. The viewfinder 1101 may include any one of the light emitting apparatuses according to the first to fourth embodiments. Alternatively, the viewfinder 1101 may be the display apparatus 1000 described in the present embodiment. In this case, the display apparatus is not limited to displaying only an image to be picked up and may display environmental information, an image pickup instruction, or the like. The environmental information may include the intensity of external light, the direction of external light, the moving speed of a subject, a possibility that a subject is shielded by a shielding material, or the like.

The photoelectric conversion apparatus 1100 includes an optical unit (not shown). The optical unit has a plurality of lenses and forms an image on the image pickup element accommodated in the housing 1104. The plurality of lenses is capable of adjusting a focal point by adjusting the relative positions of the lenses. This operation can be automatically performed.

The display apparatus according to the present embodiment may be used in a display unit of a mobile terminal. In this case, the display apparatus may have a display function and an operating function. The mobile terminal may be a cellular phone, such as a smartphone, a tablet, a head mounted display, or the like.

Figure 12B:
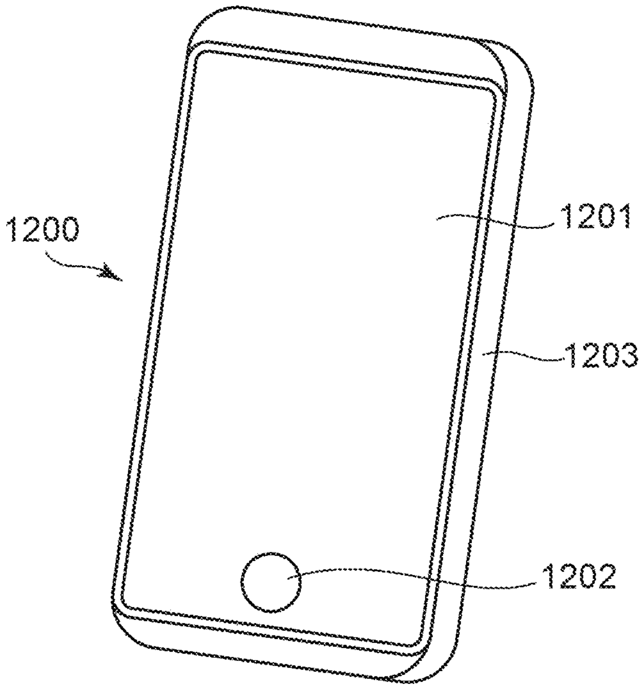
FIG. 12B is a schematic diagram that shows an example of an electronic device.

FIG. 12B is a schematic view showing an example of an electronic device according to the present embodiment. An electronic device 1200 includes a display unit 1201, an operating portion 1202, and a housing 1203. The display unit 1201 may include any one of the light emitting apparatuses according to the first to fourth embodiments. The housing 1203 may contain a circuit, a printed circuit board having the circuit, a battery, and a communication unit. The operating portion 1202 may be a button or may be a touch panel-type response unit. The operating portion may be a biometric authentication unit that identifies a fingerprint to, for example, release a lock. The electronic device including a communication unit may be regarded as a communication device.

Figure 13A:
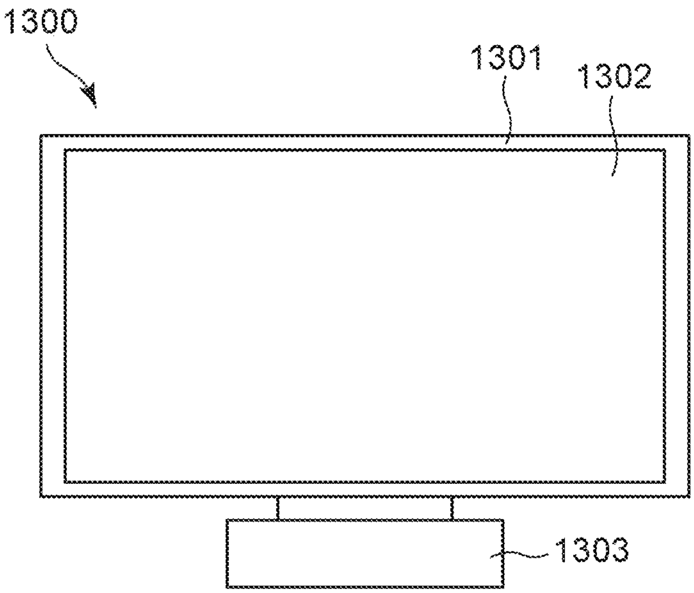
FIG. 13A is a schematic diagram that shows an example of a display apparatus.
Figure 13B:
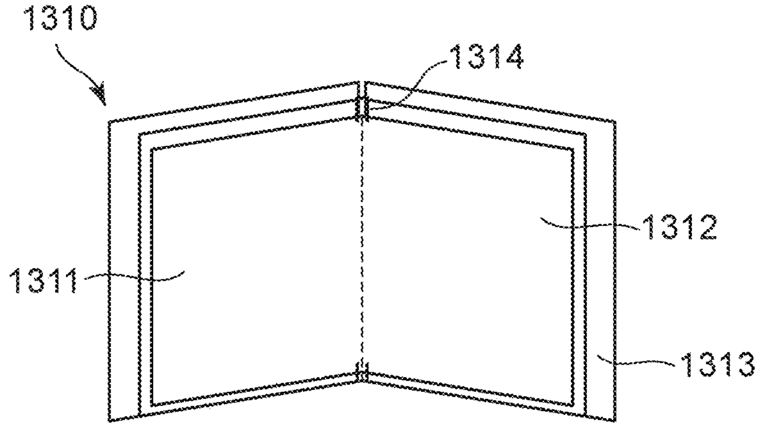
FIG. 13B is a schematic diagram that shows an example of a bendable display apparatus.

FIGS. 13A and 13B are schematic views showing examples of a display apparatus according to the present embodiment. FIG. 13A is a display apparatus, such as a television monitor and a PC monitor. The display apparatus 1300 includes a frame 1301 and a display unit 1302. The display unit 1302 may include any one of the light emitting apparatuses according to the first to fourth embodiments.

The display apparatus 1300 includes a base 1303 that supports the frame 1301 and the display unit 1302. The base 1303 is not limited to the mode of FIG. 13A. The bottom side of the frame 1301 may serve as a base.

The frame 1301 and the display unit 1302 may be curved. The radius of curvature may be greater than or equal to 5000 mm and less than or equal to 6000 mm.

FIG. 13B is a schematic view showing another example of the display apparatus according to the present embodiment. A display apparatus 1310 of FIG. 13B is configured to be foldable, and is a so-called foldable display apparatus. The display apparatus 1310 includes a first display unit 1311, a second display unit 1312, a housing 1313, and a folding point 1314. Each of the first display unit 1311 and the second display unit 1312 may include any one of the light emitting apparatuses according to the first to fourth embodiments.

The first display unit 1311 and the second display unit 1312 may make up a seamless one-sheet display apparatus. The first display unit 1311 and the second display unit 1312 may be separated at the folding point 1314. The first display unit 1311 and the second display unit 1312 may respectively display different images or the first and second display units 1311, 1312 may display one image.

Figure 14A:
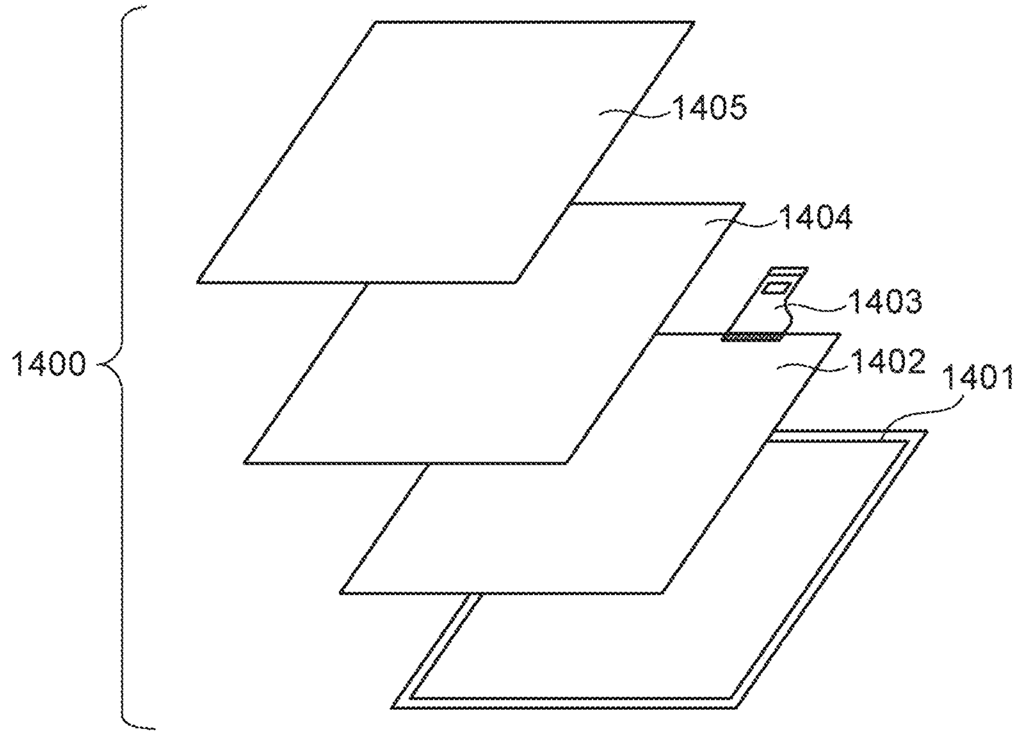
FIG. 14A is a schematic diagram that shows an example of an illumination apparatus.

FIG. 14A is a schematic view showing an example of an illumination apparatus according to the present embodiment. The illumination apparatus 1400 may include a housing 1401, a light source 1402, a circuit board 1403, an optical film 1404, and a light diffusion unit 1405. The light source 1402 may include any one of the light emitting apparatuses according to the first to fourth embodiments. The optical film may be a film that improves the color rendering property of the light source 1402. The light diffusion unit is capable of effectively diffusing light from the light source for illumination or the like to bring light to a wide range. The optical film and the light diffusion unit may be provided on a light emission side of illumination. Where necessary, a cover may be provided at an outermost part.

The illumination apparatus is an apparatus that illuminates, for example, a room. The illumination apparatus may produce light in any one of white color, daylight color, and other colors from blue to red. The illumination apparatus may include a light modulating circuit that modulates light of any one of those colors. The illumination apparatus may include any one of the light emitting apparatuses according to the first to fourth embodiments, and a power supply circuit connected thereto. The power supply circuit is a circuit that converts alternating current voltage to direct current voltage. White has a color temperature of 4200K, and daylight color has a color temperature of 5000K. The illumination apparatus may include a color filter.

The illumination apparatus according to the present embodiment may include a heat radiation portion. The heat radiation portion is to release heat inside the apparatus to the outside of the apparatus and may be made of a metal having a high specific heat, liquid silicon, or the like.

Figure 14B:
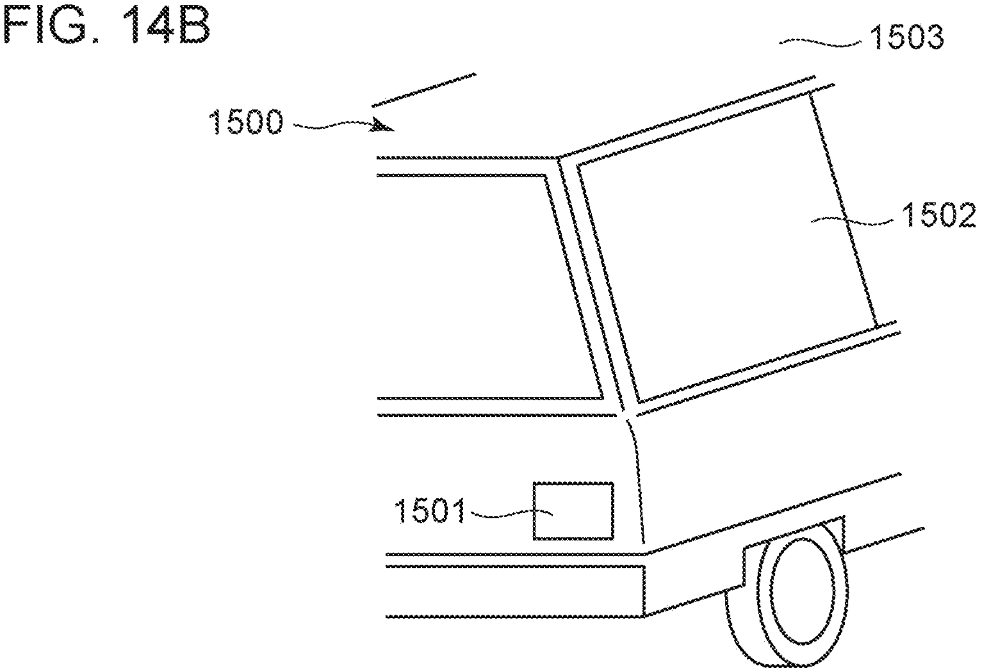
FIG. 14B is a schematic diagram that shows an example of an automobile equipped with a vehicle lamp.

FIG. 14B is a schematic view of an automobile that is an example of a moving object according to the present embodiment. The automobile includes a tail lamp that is an example of a lamp. The automobile 1500 includes the tail lamp 1501 and may be configured to, when brake operation or the like is performed, turn on the tail lamp 1501.

The tail lamp 1501 may include any one of the light emitting apparatuses according to the first to fourth embodiments. The tail lamp 1501 may include a protective member that protects a light emitting element. The protective member may be made of any material as long as the protective member has a high strength to a certain extent and can be made of polycarbonate or the like. A furan dicarboxylic acid derivative, an acrylonitrile derivative, or the like may be mixed with polycarbonate.

The automobile 1500 may include a body 1503 and windows 1502 fixed to the body 1503. The windows 1502 other than windows for viewing the front and rear of the automobile 1500 each may be a transparent display. The transparent display may include any one of the light emitting apparatuses according to the first to fourth embodiments. In this case, the component materials of the electrodes and the like of each light emitting apparatus are made up of transparent members.

The moving object according to the present embodiment may be a ship, an airplane, a drone, or the like. The moving object may include a body and a lamp provided on the body. The lamp may emit light for informing a position of the body. The lamp may include any one of the light emitting apparatuses according to the first to fourth embodiments.

Application examples of the display apparatus of each of the above-described embodiments will be described with reference to FIGS. 15A and 15B. The display apparatus is applicable to a wearable system as a wearable device, such as smartglasses, an HMD, and a smart contact lens. An image pickup and display apparatus used in such application examples includes an image pickup apparatus capable of performing photoelectric conversion of visible light and a display apparatus capable of emitting visible light.

Figure 15A:
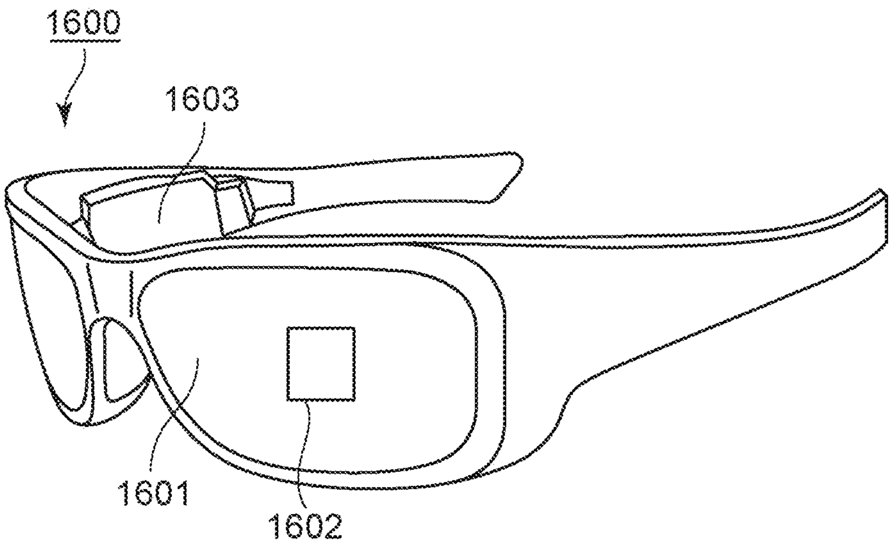
FIG. 15A is a schematic diagram that shows an example of a wearable device.

FIG. 15A illustrates glasses 1600 (smartglasses) according to one application example. An image pickup apparatus 1602, such as a CMOS sensor and an SPAD, is provided on the surface side of a lens 1601 of the glasses 1600. A display apparatus is provided on the back surface side of the lens 1601, and the display apparatus may include any one of the light emitting apparatuses according to the first to fourth embodiments.

The glasses 1600 further include a controller 1603. The controller 1603 functions as a power supply to supply electric power to the image pickup apparatus 1602 and the display apparatus of any one of the embodiments. The controller 1603 controls the operations of the image pickup apparatus 1602 and the display apparatus. An optical system for condensing light to the image pickup apparatus 1602 is formed in the lens 1601.

Figure 15B:
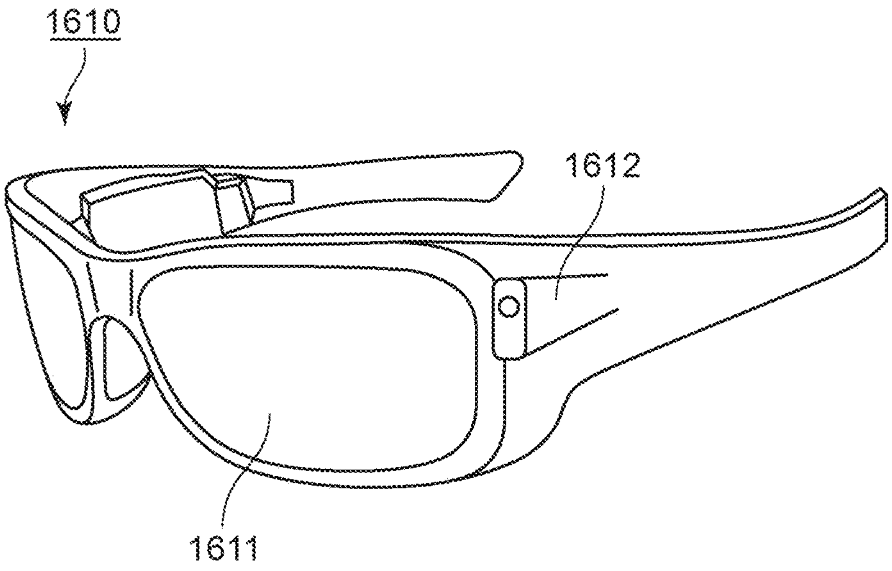
FIG. 15B is a schematic diagram that shows an example of the wearable device with an image capture apparatus.

FIG. 15B illustrates glasses 1610 (smartglasses) according to one application example. The glasses 1610 include a controller 1612, and an image pickup apparatus corresponding to the image pickup apparatus 1602, and the display apparatus are installed in the controller 1612. The display apparatus may include any one of the light emitting apparatuses according to the first to fourth embodiments. The image pickup apparatus in the controller 1612 and an optical system for projecting light emitted from a display apparatus are formed in a lens 1611, and an image is projected onto the lens 1611. The controller 1612 functions as a power supply to supply electric power to the image pickup apparatus and the display apparatus and also controls the operations of the image pickup apparatus and the display apparatus. The controller may include a line-of-sight detection unit that detects the line of sight of a wearer. Infrared light may be used to detect the line of sight. An infrared emitting unit emits infrared light to the eye of a user gazing at a display image. Infrared light emitted and reflected from the eye is detected by an image pickup unit including a light receiving element. Thus, a picked-up image of the eye is obtained. A reducer that reduces light from the infrared emitting unit to the display unit in plan view is provided, so a decrease in image quality is reduced.

The line-of-sight of the user toward the display image is detected from the picked-up image of the eye, obtained through image pickup using infrared light. A selected known technique may be applied to line-of-sight detection using a picked-up image of an eye. As an example, a line-of-sight detection method based on a Purkinje image caused by reflection of irradiation light on a cornea may be used.

More specifically, a line-of-sight detection process based on a pupil-cornea reflection method is performed. A line-of-sight vector indicating the orientation (rotational angle) of the eye is calculated in accordance with the pupil image contained in a picked-up image of the eye and a Purkinje image by using the pupil-cornea reflection method. Thus, the line of sight of a user is detected.

A display apparatus according to an embodiment of the present invention may include an image pickup apparatus having a light receiving element and may control a display image of the display apparatus in accordance with information about the line of sight of a user from the image pickup apparatus.

Specifically, the display apparatus determines a first field of view area at which the user gazes and a second field of view area other than the first field of view area in accordance with line-of-sight information. A first field of view area and a second field of view area may be determined by the controller of the display apparatus or a first field of view area and a second field of view area determined by an external controller may be received. In a display area of the display apparatus, a display resolution of the first field of view area may be controlled so as to be higher than a display resolution of the second field of view area. In other words, the resolution of the second field of view area may be made lower than the resolution of the first field of view area.

A display area includes a first display area and a second display area different from the first display area, and an area having a higher priority is determined in accordance with line-of-sight information from among the first display area and the second display area. A first field of view area and a second field of view area may be determined by the controller of the display apparatus or a first field of view area and a second field of view area determined by an external controller may be received. The resolution of an area having a higher priority may be controlled so as to be higher than the resolution of an area other than the area having a higher priority. In other words, the resolution of an area having a relatively lower priority may be decreased.

AI may be used to determine a first field of view area or an area having a higher priority. AI may be a model configured to estimate an angle of a line of sight and a distance to an object ahead of the line of sight from an image of an eye by using the images of the eye and corresponding directions in which the eye of the image is actually viewing as training data. The display apparatus, or the image pickup apparatus, or an external apparatus may include an AI program. When the external apparatus includes an AI program, the AI program is transmitted to the display apparatus via communication.

When display control is performed in accordance with line-of-sight detection, the display apparatus is suitably applicable to smartglasses further including an image pickup apparatus that picks up an outside image. The smartglasses are capable of displaying picked-up outside information in real time.

EXAMPLES

Hereinafter, examples of the present invention will be described.

Example 1

A light emitting apparatus according to Example 1, including the first organic light emitting element 100, the second organic light emitting element 200, and the third organic light emitting element as shown in FIG. 10, was manufactured as follows.

Initially, a layer made of Al was formed on the substrate 1 by a sputtering method, and then patterned by etching to form the reflective layers 11 respectively corresponding to the organic light emitting elements.

Subsequently, the optical interference layer 121 was formed on the reflective layer 11 of the first organic light emitting element 100, the optical interference layer 122 was formed on the reflective layer 11 of the second organic light emitting element 200, and the optical interference layer 123 was formed on the reflective layer 11 of the third organic light emitting element 300. The optical interference layers 121 to 123 were formed by forming a layer made of SiO with a CVD method and then patterning the layer by etching. The film thickness of the optical interference layer 121 was 213 nm, the film thickness of the optical interference layer 122 was 186 nm, and the film thickness of the optical interference layer 123 was 164 nm.

Subsequently, a layer made of ITO was deposited with a film thickness of 20 nm by a sputtering method, and the layer was etched to independently form the lower electrodes 2 of the first organic light emitting element 100, the second organic light emitting element 200, and the third organic light emitting element 300.

Subsequently, the insulating layer 5 was formed on the lower electrodes 2. Initially, a layer made of SiO was deposited with a CVD method. Then, an opening was provided in the insulating layer 5 made of SiO such that the lower electrodes 2 of the first organic light emitting element 100, the second organic light emitting element 200, and the third organic light emitting element were exposed to define a first light emission area 101, a second light emission area 201, and a third light emission area 301.

Subsequently, the organic compound layer 3 was formed on the lower electrodes 2 astride the organic light emitting elements. Specifically, the organic compound layer 3 was obtained by forming a hole injection layer, a hole transport layer, an electron block layer, the blue light emitting layer 33, the green light emitting layer 32, the red light emitting layer 31, an electron transport layer, and an electron injection layer in this order from the lower electrode 2 side.

The hole injection layer was made of the following chemical compound 1 and had a thickness of 3 nm. The hole transport layer was made of the following chemical compound 2 and had a thickness of 15 nm. The electron block layer was made of the following chemical compound 3 and had a thickness of 10 nm.

The blue light emitting layer 33 was formed to have a weight ratio of 97% of the chemical compound 4 as a host material and a weight ratio of 3% of the chemical compound 5 as a light emitting dopant, and had a thickness of 10 nm. The green light emitting layer 32 was formed to have a weight ratio of 99% of the chemical compound 4 as a host material and a weight ratio of 1% of the chemical compound 6 as a light emitting dopant, and had a thickness of 10 nm. The red light emitting layer 31 was formed to have a weight ratio of 99% of the chemical compound 4 as a host material and a weight ratio of 1% of the chemical compound 7 as a light emitting dopant, and had a thickness of 10 nm.

The electron transport layer was made of the following chemical compound 8 and had a thickness of 40 nm. The electron injection layer was made of lithium fluoride and had a thickness of 1 nm.

[Chemical 1]

CHEMICAL COMPOUND 1

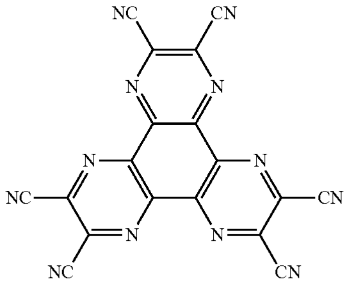

CHEMICAL COMPOUND 2

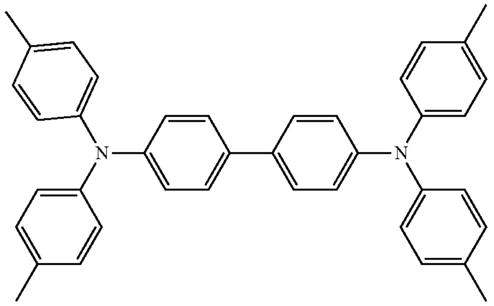

-continued

CHEMICAL COMPOUND 3

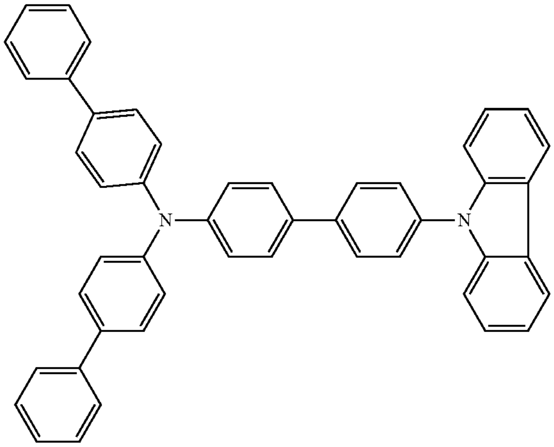

CHEMICAL COMPOUND 4

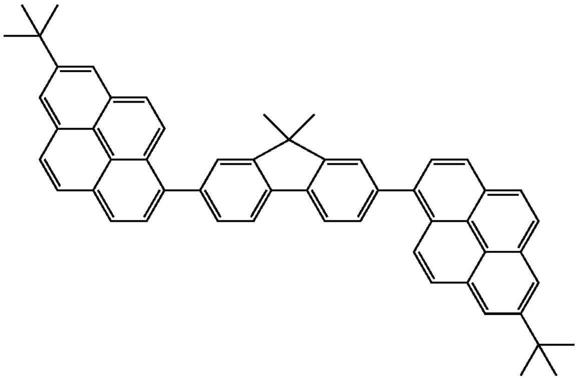

CHEMICAL COMPOUND 5

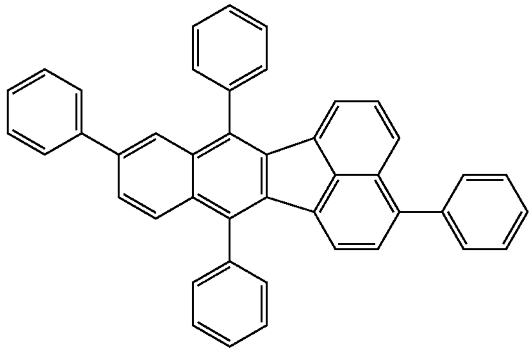

CHEMICAL COMPOUND 6

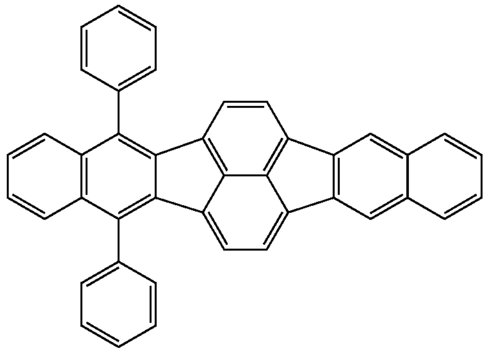

-continued

CHEMICAL COMPOUND 7

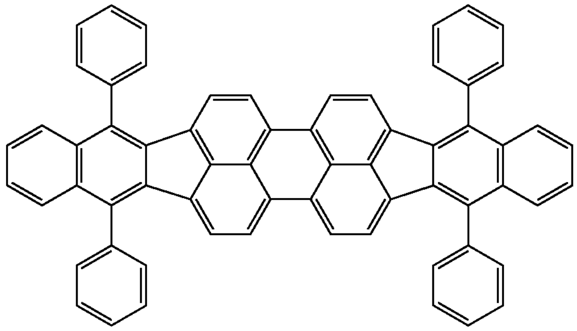

CHEMICAL COMPOUND 8

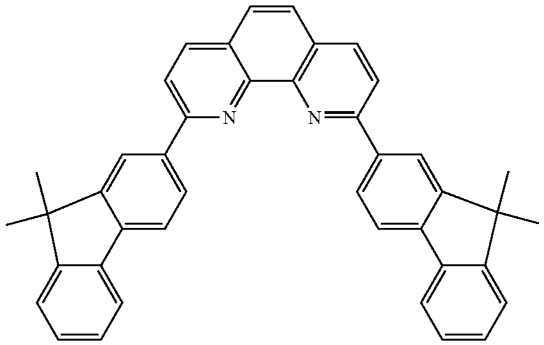

Subsequently, a layer made of an Mg—Ag alloy was formed with a thickness of 10 nm as the upper electrode 4. The ratio of Mg to Ag was set to 1:1. After that, a SiN film was formed with a thickness of 2 μm by a CVD method as the sealing layer 6. Furthermore, the planarization layer 7 was formed with a thickness of 300 nm by spin coating on the SiN film.

Subsequently, the color filter layer 13 was formed on the planarization layer 7. The color filter layer 13 included the first color filter 131 arranged to transmit red-component light, the second color filter 132 arranged to transmit green-component light, and the third color filter 133 arranged to transmit blue-component light. The thickness of each filter was set to 1 μm. The first color filter 131 was formed so as to overlap the first light emission area 101 of the first organic light emitting element 100 in a plan view. The second color filter 132 was formed so as to overlap the second light emission area 201 of the second organic light emitting element 200 in a plan view. The third color filter 133 was formed so as to overlap the third light emission area 301 of the third organic light emitting element 300 in a plan view.

Subsequently, the planarization layer 8 was formed on the color filter layer 13.

Subsequently, the light extraction structures 110, 210, 310 each having a spherical surface were formed on the planarization layer 8 as the light extraction structures respectively corresponding to the first organic light emitting element 100, the second organic light emitting element 200, and the third organic light emitting element 300. Air was in contact with the light extraction structures 110, 210, 310.

Comparative Example 1

A light emitting apparatus according to Comparative Example 1 was formed similarly to Example 1 except the film thickness of each of the optical interference layers 121, 122, 123. In Comparative Example 1, the film thickness of the optical interference layer 121 was 202 nm, the film thickness of the optical interference layer 122 was 177 nm, and the film thickness of the optical interference layer 123 was 156 nm. In the light emitting apparatus according to Comparative Example 1, as compared to the light emitting apparatus according to Example 1, the optical interference layer 121 of the first organic light emitting element 100, the optical interference layer 122 of the second organic light emitting element 200, and the optical interference layer 123 of the third organic light emitting element 300 each had a thin film thickness.

Comparison Between Example 1 and Comparative Example 1

In Example 1, a phase change at the time of reflecting on the reflection surface S2 that is the upper surface of the reflective layer 11 was −150 degrees. The peak wavelength of the PL spectrum of the chemical compound 5 was 460 nm. The peak wavelength of the PL spectrum of the chemical compound 6 was 530 nm. The peak wavelength of the PL spectrum of the chemical compound 7 was 610 nm.

The direction of light traveling through the red light emitting layer 31 at the time when light with a peak wavelength of 610 nm of the PL spectrum of the chemical compound 7 in the first organic light emitting element 100 of the light emitting apparatus according to Example 1 was calculated. As a result, an angle formed between the direction and the normal direction of the principal surface S1 of the substrate 1 was 15 degrees.

The direction of light traveling through the green light emitting layer 32 at the time when light with a peak wavelength of 530 nm of the PL spectrum of the chemical compound 6 in the second organic light emitting element 200 of the light emitting apparatus according to Example 1 was calculated. As a result, an angle formed between the direction and the normal direction of the principal surface S1 of the substrate 1 was 15 degrees.

The direction of light that travels through the blue light emitting layer 33 at the time when light with a peak wavelength of 460 nm of the PL spectrum of the chemical compound 7 in the third organic light emitting element 300 of the light emitting apparatus according to Example 1 was calculated. As a result, an angle formed between the direction and the normal direction of the principal surface S1 of the substrate 1 was 15 degrees.

In the first organic light emitting element 100 of the light emitting apparatus according to Example 1, a ray of light emitted from a light emitting point at a location 1.2 μm radially outward from the center of the first light emission area 101 in a plan view was kept track. As a result, it was found that, when the ray travelled through the red light emitting layer 31 in a direction that makes an angle of 15 degrees with the normal direction of the principal surface S1 of the substrate 1, the ray reached the inclined portion 21 of the light extraction structure 110. At this time, the inclined portion 21 was part of the spherical shape of the light extraction structure 110 and had an inclination angle of 50 degrees. The light emitting point was present in a circular shape with a radius of 1.2 μm about the center of the first light emission area 101. The inclined portion 21 was present in a circular shape so as to surround in a plan view a circle in which the light emitting point is present. Furthermore, it was found that, when light traveling in the above-described direction reached the inclined portion 21, the light was refracted and emitted in a direction substantially perpendicular to the principal surface S1 of the substrate 1.

In the second organic light emitting element 200 of the light emitting apparatus according to Example 1, a ray of light emitted from a light emitting point at a location 1.2 μm radially outward from the center of the second light emission area 201 in a plan view was kept track. As a result, it was found that, when the ray travelled through the green light emitting layer 32 in a direction that makes an angle of 15 degrees with the normal direction of the principal surface S1 of the substrate 1, the ray reached the inclined portion 21 of the light extraction structure 210. At this time, the inclined portion 21 was part of the spherical shape of the light extraction structure 210 and had an inclination angle of 50 degrees. The light emitting point was present in a circular shape with a radius of 1.2 μm about the center of the second light emission area 201. The inclined portion 21 was present in a circular shape so as to surround in a plan view a circle in which the light emitting point is present. Furthermore, it was found that, when light traveling in the above-described direction reached the inclined portion 21, the light was refracted and emitted in a direction substantially perpendicular to the principal surface S1 of the substrate 1.

In the third organic light emitting element 300 of the light emitting apparatus according to Example 1, a ray of light emitted from a light emitting point at a location 1.2 μm radially outward from the center of the third light emission area 301 in a plan view was kept track. As a result, it was found that, when the ray travelled through the blue light emitting layer 33 in a direction that makes an angle of 15 degrees with the normal direction of the principal surface S1 of the substrate 1, the ray reached the inclined portion 21 of the light extraction structure 310. At this time, the inclined portion 21 was part of the spherical shape of the light extraction structure 310 and had an inclination angle of 50 degrees. The light emitting point was present in a circular shape with a radius of 1.2 μm about the center of the third light emission area 301. The inclined portion 21 was present in a circular shape so as to surround in a plan view a circle in which the light emitting point is present. Furthermore, it was found that, when light traveling in the above-described direction reached the inclined portion 21, the light was refracted and emitted in a direction substantially perpendicular to the principal surface S1 of the substrate 1.

The direction of light traveling through the red light emitting layer 31 at the time when light with a peak wavelength of 610 nm of the PL spectrum of the chemical compound 7 in the first organic light emitting element 100 of the light emitting apparatus according to Comparative Example 1 was calculated. As a result, an angle formed between the direction and the normal direction of the principal surface S1 of the substrate 1 was zero degrees.

The direction of light traveling through the green light emitting layer 32 at the time when light with a peak wavelength of 530 nm of the PL spectrum of the chemical compound 6 in the second organic light emitting element 200 of the light emitting apparatus according to Comparative Example 1 was calculated. As a result, an angle formed between the direction and the normal direction of the principal surface S1 of the substrate 1 was zero degrees.

The direction of light that travels through the blue light emitting layer 33 at the time when light with a peak wavelength of 460 nm of the PL spectrum of the chemical compound 7 in the third organic light emitting element 300 of the light emitting apparatus according to Comparative Example 1 was calculated. As a result, an angle formed between the direction and the normal direction of the principal surface S1 of the substrate 1 was zero degrees.

Comparison in Characteristics Between Example 1 and Comparative Example 1

A luminance in the front direction was evaluated by passing a current of the same magnitude through the light emitting apparatus according to Example 1 and the light emitting apparatus according to Comparative Example 1 to cause each organic light emitting element to produce light. As a result, the luminance in the front direction of the light emitting apparatus according to Example 1 was 1.3 times as large as a front luminance of the light emitting apparatus according to Comparative Example 1. Therefore, Example 1 had an increased luminance in the front direction as compared to Comparative Example 1.

Embodiments of the present invention are not limited to the above-described embodiments. Various changes or modifications are applicable without departing from the spirit and scope of the present invention. Therefore, the following claims are attached to show the scope of the present invention.

According to the present invention, it is possible to increase the intensity of light that is emitted in a front direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A light emitting apparatus comprising an organic light emitting element disposed on a principal surface of a substrate, wherein the organic light emitting element includes a first electrode, a second electrode, and an organic layer including a light emitting layer and interposed between the first electrode and the second electrode, a light extraction structure disposed on a light emission side of the organic layer, and a reflection surface disposed so as to sandwich the organic layer with the light extraction structure, the light emitting layer contains a first light emitting material, an optical distance between the light emitting layer and the reflection surface is a value with which, where a wavelength included in a peak wavelength range of a PL spectrum of the first light emitting material is a first wavelength, light with the first wavelength, traveling through the light emitting layer in a first direction that intersects with a normal direction of the principal surface of the substrate, and light with the first wavelength, traveling through the light emitting layer in a second direction that intersects with the normal direction of the principal surface of the substrate and that is different from the first direction, both are intensified, an absolute value of an angle formed between the normal direction of the principal surface of the substrate and the first direction and an absolute value of an angle formed between the normal direction of the principal surface of the substrate and the second direction are the same, the light extraction structure has a first inclined portion and a second inclined portion, first incident light that is light with the first wavelength, traveling through the light emitting layer in the first direction and having reached the first inclined portion, is refracted at the first inclined portion and emitted in a third direction from the light extraction structure, second incident light that is light with the first wavelength, traveling through the light emitting layer in the second direction and having reached the second inclined portion, is refracted at the second inclined portion and emitted in a fourth direction from the light extraction structure, an absolute value of an angle formed between the normal direction of the principal surface of the substrate and the third direction and an absolute value of an angle formed between the normal direction of the principal surface of the substrate and the fourth direction both are greater than or equal to zero degrees and less than or equal to five degrees, and wherein the expression (1) is satisfied, $$Lb/\cos\theta_1 \times (1+\sin(90-2\theta_1)) = \lambda_1 \times (m - \varphi b/360) \quad (1)$$

where, in the expression (1), $\lambda_1$ denotes the first wavelength (nm), $\theta_1$ denotes the angle (degrees) formed between the first direction and the normal direction of the principal surface of the substrate, Lb denotes the optical distance (nm) between the light emitting layer and the reflection surface, $\varphi_b$ denotes a phase change (degrees) when reflected on the reflection surface, and m is an integer greater than or equal to zero.

2. The light emitting apparatus according to claim 1, wherein the first incident light is light obtained such that light with the first wavelength, emitted from the light emitting layer toward the first electrode, reflected on the reflection surface, and traveling in the first direction toward the second electrode, and light with the first wavelength, emitted in the first direction from the light emitting layer toward the second electrode constructively interfere with each other, and the second incident light is light obtained such that light with the first wavelength, emitted from the light emitting layer toward the first electrode, reflected on the reflection surface, and traveling in the second direction toward the second electrode, and light with the first wavelength, emitted in the second direction from the light emitting layer toward the second electrode constructively interfere with each other.

3. The light emitting apparatus according to claim 1, wherein a half-reflection surface is provided between the organic layer and the light extraction structure, and an optical distance between the reflection surface and the half-reflection surface is a value with which light with the first wavelength, traveling through the light emitting layer in the first direction, and light with the first wavelength, traveling through the light emitting layer in the second direction line-symmetric from the first direction with respect to an axis that coincides with a normal line to the principal surface of the substrate, both are intensified.

4. The light emitting apparatus according to claim 3, wherein the first incident light is light obtained such that light with the first wavelength, emitted from the light emitting layer toward the second electrode, reflected on the half-reflection surface toward the first electrode, reflected on the reflection surface toward the second electrode, and traveling in the first direction, and light with the first wavelength, emitted from the light emitting layer toward the second electrode in the first direction, constructively interfere with each other, and the second incident light is light obtained such that light with the first wavelength, emitted from the light emitting layer toward the second electrode, reflected on the half-reflection surface toward the first electrode, reflected on the reflection surface toward the second electrode, and traveling in the second direction, and light with the first wavelength, emitted from the light emitting layer toward the second electrode in the second direction, constructively interfere with each other.

5. The light emitting apparatus according to claim 3, wherein the expression (2) is satisfied, $$La/\cos\theta_1 \times (1+\cos(2\theta_1)) = \lambda_1 \times (I - \varphi b/360 - \varphi t/360) \quad (2)$$

where, in the expression (2), $\lambda_1$ denotes the first wavelength (nm), $\theta_1$ denotes the angle (degrees) formed between the first direction and the normal direction of the principal surface of the substrate, La denotes an optical distance (nm) between the reflection surface and the half-reflection surface, φb denotes a phase change (degrees) when reflected on the reflection surface, φt denotes a phase change (degrees) when reflected on the half-reflection surface, and I is an integer greater than or equal to zero.

6. The light emitting apparatus according to claim 1, wherein the expressions (3) and (4) are satisfied, $$\theta_n = \arcsin(\sin\theta_1' \times N_1/N_n) \quad (3)$$

$$\theta_{ex} = -\arcsin(\sin(-\theta_n + \psi) \times N_n/N_{ex}) + \psi \quad (4)$$

where, in the expressions (3) and (4), $\theta_n$ denotes an angle (degrees) formed between a traveling direction of the incident light through the light extraction structure and the normal direction of the principal surface of the substrate, $\theta_1'$ denotes the angle (degrees) formed between the first direction and the normal direction of the principal surface of the substrate, $\theta_{ex}$ denotes an angle (degrees) formed between the third direction and the normal direction of the principal surface of the substrate, ψ denotes an angle (degrees) formed between a part of the first inclined portion, to which the first incident light enters, and a straight line parallel to the principal surface of the substrate or an angle (degrees) formed between a part of the second inclined portion, to which the second incident light enters, and the straight line parallel to the principal surface of the substrate, $N_1$ denotes a refractive index of the light emitting layer, $N_n$ denotes a refractive index of the light extraction structure, and $N_{ex}$ denotes a refractive index of a region from which the first incident light is emitted from the first inclined portion or a region from which the second incident light is emitted from the second inclined portion, In the expressions (3) and (4), $\theta_n$, $\theta_1'$, and $\theta_{ex}$ are expressed in angle positive in a clockwise direction and negative in a counterclockwise direction with a normal line to the principal surface of the substrate as an initial line, and ψ is expressed in angle positive in a clockwise direction and negative in a counterclockwise direction with a straight line parallel to the principal surface of the substrate as an initial line.

7. The light emitting apparatus according to claim 1, further comprising a reflective layer disposed across the first electrode from the light extraction structure, wherein the reflective layer has the reflection surface.

8. The light emitting apparatus according to claim 1, wherein the peak wavelength range is a wavelength range of greater than or equal to ($\lambda_{p1}$−5) nm and less than or equal to ($\lambda_{p1}$+5) nm where a peak wavelength of the PL spectrum of the first light emitting material is $\lambda_{p1}$ (nm).

9. The light emitting apparatus according to claim 1, wherein the first wavelength is a peak wavelength of the PL spectrum of the first light emitting material.

10. The light emitting apparatus according to claim 1, wherein the light extraction structure has a curved surface at least at a part including the inclined portion.

11. The light emitting apparatus according to claim 10, wherein the light extraction structure has a spherical surface at least at a part including the inclined portion.

12. The light emitting apparatus according to claim 1, wherein the light extraction structure is a microlens.

13. The light emitting apparatus according to claim 1, wherein a light emitting point of the incident light in the light emitting layer lies between a center of a light emission area of the light emitting layer and an outer periphery of the light emission area in a plan view of the substrate.

14. The light emitting apparatus according to claim 1, wherein a light emitting point of the incident light in the light emitting layer surrounds a center of a light emission area of the light emitting layer in a plan view of the substrate.

15. The light emitting apparatus according to claim 1, further comprising a color filter between the second electrode and the light extraction structure.

16. A display apparatus comprising:

the light emitting apparatus according to claim 1; and a transistor connected to the organic light emitting element.

17. A photoelectric conversion apparatus comprising:

an optical unit having a plurality of lenses; an image pickup device arranged to receive light passing through the optical unit; and a display unit arranged to display an image picked up by the image pickup device, wherein the display unit includes the light emitting apparatus according to claim 1.

18. An electronic device comprising: a display unit including the light emitting apparatus according to claim 1, a housing on which the display unit is provided, and a communication unit provided in the housing and arranged to communicate with an external source.

19. An illumination apparatus comprising: a light source including the light emitting apparatus according to claim 1, and a light diffusion unit or optical film arranged to transmit light emitted from the light source.

20. A moving object comprising: a lamp including the light emitting apparatus according to claim 1; and a body on which the lamp is provided.

21. A light emitting apparatus comprising a first organic light emitting element and a second organic light emitting element disposed on a substrate, wherein each of the first organic light emitting element and the second organic light emitting element includes a first electrode, a second electrode, and an organic layer including a light emitting layer and interposed between the first electrode and the second electrode, a light extraction structure disposed on a light emission side of the organic layer, and a reflection surface disposed so as to sandwich the organic layer with the light extraction structure, the organic layer of the first organic light emitting element includes a first light emitting layer containing a first light emitting material, the organic layer of the second organic light emitting element includes a second light emitting layer containing a second light emitting material, in the first organic light emitting element, an optical distance between the first light emitting layer and the reflection surface is a value with which, where a wavelength included in a peak wavelength range of a PL spectrum of the first light emitting material is a first wavelength, light with the first wavelength, traveling through the light emitting layer in a first direction that intersects with a normal direction of the principal surface of the substrate, and light with the first wavelength, traveling through the light emitting layer in a second direction that intersects with the normal direction of the principal surface of the substrate and that is different from the first direction, both are intensified, an absolute value of an angle formed between the normal direction of the principal surface of the substrate and the first direction and an absolute value of an angle formed between the normal direction of the principal surface of the substrate and the second direction are the same, the light extraction structure has a first inclined portion and a second inclined portion, first incident light that is light with the first wavelength, traveling through the light emitting layer in the first direction and having reached the first inclined portion, is refracted at the first inclined portion and emitted in a third direction from the light extraction structure, second incident light that is light with the first wavelength, traveling through the light emitting layer in the second direction and having reached the second inclined portion, is refracted at the second inclined portion and emitted in a fourth direction from the light extraction structure, in the second organic light emitting element, an optical distance between the second light emitting layer and the reflection surface is a value with which, where a wavelength included in a peak wavelength range of a PL spectrum of the second light emitting material is a second wavelength, light with the second wavelength, traveling through the light emitting layer in a fifth direction that intersects with the normal direction of the principal surface of the substrate, and light with the second wavelength, traveling through the light emitting layer in a sixth direction that intersects with the normal direction of the principal surface of the substrate and that is different from the fifth direction, both are intensified, an absolute value of an angle formed between the normal direction of the principal surface of the substrate and the fifth direction and an absolute value of an angle formed between the normal direction of the principal surface of the substrate and the sixth direction are the same, the light extraction structure has a third inclined portion and a fourth inclined portion, third incident light that is light with the second wavelength, traveling through the light emitting layer in the fifth direction and having reached the third inclined portion, is refracted at the third inclined portion and emitted in a seventh direction from the light extraction structure, fourth incident light that is light with the second wavelength, traveling through the light emitting layer in the sixth direction and having reached the fourth inclined portion, is refracted at the fourth inclined portion and emitted in an eighth direction from the light extraction structure, an absolute value of an angle formed between the normal direction of the principal surface of the substrate and the third direction, an absolute value of an angle formed between the normal direction of the principal surface of the substrate and the fourth direction, an absolute value of an angle formed between the normal direction of the principal surface of the substrate and the seventh direction, and an absolute value of an angle formed between the normal direction of the principal surface of the substrate and the eighth direction all are greater than or equal to zero degrees and less than or equal to five degrees, a full width at half maximum of the PL spectrum of the second light emitting material is greater than a full width at half maximum of the PL spectrum of the first light emitting material, and an absolute value of an angle formed between the normal direction of the principal surface of the substrate and the fifth direction and an absolute value of an angle formed between the normal direction of the principal surface of the substrate and the sixth direction are less than an absolute value of an angle formed between the normal direction of the principal surface of the substrate and the first direction and an absolute value of an angle formed between the normal direction of the principal surface of the substrate and the second direction.

22. The light emitting apparatus according to claim 21, wherein the second light emitting material is a phosphorescent material.

23. The light emitting apparatus according to claim 22, wherein the first light emitting material is a fluorescent material.

24. A light emitting apparatus comprising an organic light emitting element disposed on a principal surface of a substrate, wherein the organic light emitting element includes a first electrode, a second electrode, and an organic layer including a light emitting layer and interposed between the first electrode and the second electrode, a light extraction structure disposed on a light emission side of the organic layer, and a reflection surface disposed so as to sandwich the organic layer with the light extraction structure, the light emitting layer contains a first light emitting material, an optical distance between the light emitting layer and the reflection surface is a value with which, where a wavelength included in a peak wavelength range of a PL spectrum of the first light emitting material is a first wavelength, light with the first wavelength, traveling through the light emitting layer in a first direction that intersects with a normal direction of the principal surface of the substrate, and light with the first wavelength, traveling through the light emitting layer in a second direction that intersects with the normal direction of the principal surface of the substrate and that is different from the first direction, both are intensified, an absolute value of an angle formed between the normal direction of the principal surface of the substrate and the first direction and an absolute value of an angle formed between the normal direction of the principal surface of the substrate and the second direction are the same, the light extraction structure has a first inclined portion and a second inclined portion, first incident light that is light with the first wavelength, traveling through the light emitting layer in the first direction and having reached the first inclined portion, is refracted at the first inclined portion and emitted in a third direction from the light extraction structure, second incident light that is light with the first wavelength, traveling through the light emitting layer in the second direction and having reached the second inclined portion, is refracted at the second inclined portion and emitted in a fourth direction from the light extraction structure, and an absolute value of an angle formed between the normal direction of the principal surface of the substrate and the third direction and an absolute value of an angle formed between the normal direction of the principal surface of the substrate and the fourth direction both are greater than or equal to zero degrees and less than or equal to five degrees, wherein a half-reflection surface is provided between the organic layer and the light extraction structure, and an optical distance between the reflection surface and the half-reflection surface is a value with which light with the first wavelength, traveling through the light emitting layer in the first direction, and light with the first wavelength, traveling through the light emitting layer in the second direction line-symmetric from the first direction with respect to an axis that coincides with a normal line to the principal surface of the substrate, both are intensified and wherein the expression (2) is satisfied, $$La/\cos\theta_1 \times (1+\cos(2\theta_1)) = \lambda_1 \times (I - \varphi b/360 - \varphi t/360) \quad (2)$$

where, in the expression (2), $\lambda_1$ denotes the first wavelength (nm), $\theta_1$ denotes the angle (degrees) formed between the first direction and the normal direction of the principal surface of the substrate, La denotes an optical distance (nm) between the reflection surface and the half-reflection surface, φb denotes a phase change (degrees) when reflected on the reflection surface, φt denotes a phase change (degrees) when reflected on the half-reflection surface, and I is an integer greater than or equal to zero.

* * * * *